(12) United States Patent
Yoshino et al.

(10) Patent No.: US 12,374,563 B2
(45) Date of Patent: Jul. 29, 2025

(54) SEMICONDUCTOR DEVICE MANUFACTURING METHOD

(71) Applicant: SHINKAWA LTD., Tokyo (JP)

(72) Inventors: Hiroaki Yoshino, Tokyo (JP); Shinsuke Tei, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 18/038,711

(22) PCT Filed: Nov. 25, 2020

(86) PCT No.: PCT/JP2020/043784
§ 371 (c)(1),
(2) Date: May 25, 2023

(87) PCT Pub. No.: WO2022/113193
PCT Pub. Date: Jun. 2, 2022

(65) Prior Publication Data
US 2024/0006193 A1    Jan. 4, 2024

(51) Int. Cl.
*H01L 21/603*      (2006.01)
*H01L 23/00*       (2006.01)

(52) U.S. Cl.
CPC ............ *H01L 21/603* (2021.08); *H01L 24/48* (2013.01); *H01L 24/745* (2013.01); *H01L 2224/4809* (2013.01); *H01L 2224/49177* (2013.01); *H01L 2224/7855* (2013.01); *H01L 2224/85051* (2013.01)

(58) Field of Classification Search
None
See application file for complete search history.

(56) References Cited

U.S. PATENT DOCUMENTS 5,037,023 A * 8/1991 Akiyama ............... H01L 24/85
                                                     228/180.5
5,395,035 A    3/1995 Nakao
(Continued)

FOREIGN PATENT DOCUMENTS

JP    H06177195       6/1994
JP    2004247672      9/2004
(Continued)

OTHER PUBLICATIONS

"Office Action of Korea Counterpart Application", issued on Apr. 25, 2024, with English translation thereof, p. 1-p. 19.
(Continued)

*Primary Examiner* — Devang R Patel
(74) *Attorney, Agent, or Firm* — JCIPRNET

(57) ABSTRACT

The semiconductor device manufacturing method includes a bonding step of bonding a wire to an electrode (35a), a looping wire formation step of looping the wire from the electrode (35a) to a dummy electrode (34) to form a looping wire (50a), a pressing step of pressing a part of the wire, a moving step of moving the pressed part of the wire directly above the electrode, a wire separation step of separating the wire partially from a wire supply to form a pin wire (55a) extending vertically upward from the electrode (35a), wherein the looping wire formation step adjusts the looping height of the wire to set the length of the looping wire to a predetermined length.

3 Claims, 32 Drawing Sheets

(56) References Cited

U.S. PATENT DOCUMENTS

| | | | |
|---|---|---|---|
| 6,803,665 B1* | 10/2004 | Megahed | H01L 23/645 |
| | | | 257/784 |
| 8,143,155 B2 | 3/2012 | Mii et al. | |
| 8,772,952 B2 | 7/2014 | Yasunaga et al. | |
| 8,815,732 B2 | 8/2014 | Mii et al. | |
| 9,024,454 B2 | 5/2015 | Yasunaga et al. | |
| 11,094,666 B2* | 8/2021 | Choi | H01L 24/48 |
| 2004/0164128 A1 | 8/2004 | Mii | |
| 2011/0074019 A1* | 3/2011 | Yasunaga | H01L 23/49866 |
| | | | 257/737 |
| 2015/0132888 A1 | 5/2015 | Colosimo, Jr. et al. | |
| 2015/0246411 A1 | 9/2015 | Sekine et al. | |
| 2016/0358883 A1 | 12/2016 | Yoshino et al. | |
| 2017/0040280 A1 | 2/2017 | Colosimo, Jr. et al. | |
| 2017/0110439 A1 | 4/2017 | Yuan et al. | |
| 2017/0345787 A1 | 11/2017 | Colosimo, Jr. et al. | |
| 2019/0254546 A1 | 8/2019 | Galligan et al. | |
| 2020/0043889 A1 | 2/2020 | Huang et al. | |

FOREIGN PATENT DOCUMENTS

| | | |
|---|---|---|
| JP | 2011071317 | 4/2011 |
| JP | 2015533258 | 11/2015 |
| JP | 2016066633 | 4/2016 |
| JP | 6297553 | 3/2018 |
| KR | 20110054038 | 5/2011 |
| KR | 20150061659 A * | 6/2015 |
| KR | 20160120780 | 10/2016 |

OTHER PUBLICATIONS

"International Search Report (Form PCT/ISA/210) of PCT/JP2020/043784", mailed on Feb. 16, 2021, with English translation thereof, pp. 1-6.

"Office Action of Taiwan Counterpart Application", issued on Jul. 13, 2022, with partial English translation thereof, p. 1-p. 15.

"Office Action of Taiwan Counterpart Application", issued on Dec. 28, 2022, with partial English translation thereof, p. 1-p. 19.

"Office Action of Korea Counterpart Application", issued on Nov. 7, 2024, with English translation thereof, p. 1-p. 18.

"First Office Action Notification of China Counterpart Application", issued on May 30, 2025, with English translation thereof, pp. 1-28.

* cited by examiner

SEMICONDUCTOR DEVICE MANUFACTURING METHOD

CROSS-REFERENCE TO RELATED APPLICATION

This application is a 371 application of the International PCT application serial no. PCT/JP2020/043784, filed on Nov. 25, 2020. The entirety of the above-mentioned patent application is hereby incorporated by reference herein and made a part of this specification.

TECHNICAL FIELD

The present invention relates to a method of forming a wire on an electrode of a semiconductor chip or substrate, a method of manufacturing a semiconductor device including the formed wire, and a manufacturing apparatus thereof.

RELATED ART

There is a need to form, on an electrode of a semiconductor chip or substrate, a pin wire that extends vertically upward from the electrode. Therefore, a method has been proposed, which after bonding a wire to a bonding position on a substrate using a bonding tool, extends the wire to another position on the substrate and presses a part of the wire at another position, and then, after moving the bonding tool to place the wire vertically above the electrode, cuts the wire to form a pin wire (see Patent Literature 1, for example).

CITATION LIST

Patent Literature

[Patent Literature 1] Japanese Patent No. 6297553

SUMMARY OF INVENTION

Technical Problem

In addition, when forming a pin wire on an electrode of a semiconductor chip using the conventional technique described in Patent Literature 1, a part of the wire is pressed at another location, for example, on the substrate outside the semiconductor chip. In this case, since another location can be freely selected, the height of the pin wire can be freely adjusted by adjusting the position of the another location.

On the other hand, in recent years, semiconductor devices with densely arranged electrodes, such as semiconductor devices in which semiconductor chips are laminated in multiple stages, have been used. When trying to form a pin wire on the electrode of such a semiconductor device by the conventional technique described in Patent Literature 1, due to space constraints, a part of the wire has to be pressed at a location on the semiconductor chip, which has a small withstand load, and this may lead to damage to the semiconductor chip.

In this case, it is conceivable to press a part of the wire at a specific position such as a dummy electrode on the semiconductor chip where the withstand load is large, but since the distance between each electrode and the pressing position cannot be freely selected, it may be difficult to adjust the height of the pin wire, and the wire may not be formed freely.

Accordingly, an object of the present invention is to improve the degree of freedom in wire shape.

Solution to Problem

A wire forming method according to the present invention is for forming a pin wire with a bonding tool. The wire forming method includes: a bonding process of bonding a wire to a first bonding point with the bonding tool; a looping wire forming process of forming a looping wire between the first bonding point and a second bonding point and adjusting a length of the looping wire to a predetermined length by adjusting a looping height of the wire; a pressing process of pressing a part of the wire against the second bonding point to form a thin portion; and a wire separation process of raising the bonding tool to cut the wire at the thin portion.

Thus, the length of the looping wire can be adjusted to the predetermined length, and the degree of freedom in the shape of the pin wire can be improved.

In the wire forming method according to the present invention, the looping wire forming process may include: a first process of raising a tip of the bonding tool from the first bonding point; a second process of moving the tip of the bonding tool in a direction opposite to the second bonding point after the first process; a third process of raising the tip of the bonding tool again after the second process; and a fourth process of moving the tip of the bonding tool in an arc toward the second bonding point after the third process, and the length of the looping wire may be adjusted to the predetermined length by adjusting an amount of movement of the tip of the bonding tool in at least one of the first process to the third process.

Thus, the length of the looping wire can be adjusted to the predetermined length by a simple method, and the degree of freedom in the shape of the pin wire can be improved.

The wire forming method according to the present invention may include a moving process of moving the thin portion to be directly above the first bonding point with the bonding tool, and the wire separation process may cut the wire from a wire supply at the thin portion of the wire and then form the pin wire extending vertically upward from the first bonding point.

Thus, the pin wire can be formed by a simple method.

In the wire forming method according to the present invention, the second bonding point may be a dummy electrode, the wire forming method may include a bump forming process of forming a bump on the dummy electrode before the bonding process, the bonding process may perform ball bonding at the first bonding point, and the pressing process may press a part of the wire onto the bump formed on the dummy electrode to form the thin portion.

Since the bump is formed on the dummy electrode having a large withstand load and a part of the wire is pressed thereon, damage to the semiconductor chip can be effectively suppressed. Further, by using ball bonding for bonding to the first bonding point, it is possible to effectively suppress damage near the first bonding point of the semiconductor chip.

A semiconductor device manufacturing method according to the present invention is for manufacturing a semiconductor device including, on a plurality of electrodes of a semiconductor chip or a substrate, a plurality of pin wires respectively extending vertically upward from the electrodes. The semiconductor device manufacturing method includes: (a) a bonding process of bonding a wire to the electrode with a wire bonding tool; (b) a looping wire forming process of looping the wire from the electrode to a common pressing position arranged on a surface of the semiconductor chip or the substrate with the wire bonding tool to form a looping wire; (c) a pressing process of pressing a part of the wire against the pressing position with the wire bonding tool; (d) a moving process of moving the pressed part of the wire to be directly above the electrode with the wire bonding tool; and (e) a wire separation process of separating the wire from a wire supply at the part of the wire to form the pin wire extending vertically upward from the electrode. (a) through (e) are repeatedly executed to form each of the pin wires on each of the electrodes, and the looping wire forming process adjusts a looping height of the wire to adjust a length of the looping wire to a predetermined length.

Thus, even if a part of the wire is pressed against the common pressing position for a plurality of electrodes, the looping height of the wire can be adjusted to adjust the length of the looping wire to the predetermined length, thereby freely adjusting the height of the pin wire.

In the semiconductor device manufacturing method according to the present invention, the looping wire forming process may include: a first process of raising a tip of the wire bonding tool from the electrode; a second process of moving the tip of the wire bonding tool in a direction opposite to the pressing position after the first process; a third process of raising the tip of the wire bonding tool again after the second process; and a fourth process of moving the tip of the wire bonding tool in an arc toward the pressing position after the third process, and the length of each looping wire may be adjusted to a predetermined length by adjusting an amount of movement of the tip of the wire bonding tool in at least one of the first process to the third process.

Thus, the length of the looping wire can be adjusted to the predetermined length by a simple method, and the height of the pin wire can be easily adjusted.

In the semiconductor device manufacturing method according to the present invention, a dummy electrode may be arranged at the pressing position, the semiconductor device manufacturing method may include a bump forming process of forming a bump on the dummy electrode before the bonding process, the bonding process may perform ball bonding on the electrode, and the pressing process may press the part of the wire onto the bump formed on the dummy electrode.

Since the bump is formed on the common dummy electrode having a large withstand load and a part of the wire is pressed thereon, damage to the semiconductor chip can be effectively suppressed. Further, by using ball bonding for bonding to the electrode on the semiconductor chip, it is possible to effectively suppress damage near the electrode.

In the semiconductor device manufacturing method according to the present invention, each electrode may be recessed from the surface of the semiconductor chip or the substrate, and the bump forming process may form the bump on the electrode so that an upper end of the bump is higher than the surface of the semiconductor chip or the substrate.

Since the bump is formed with the upper end of the bump higher than the surface of the semiconductor chip or the substrate, and a part of the wire is pressed onto the bump, it is possible to suppress damage to the semiconductor chip or the substrate caused by the wire hitting the surface of the semiconductor chip or the substrate when the wire is pressed.

A semiconductor device manufacturing apparatus according to the present invention is for manufacturing a semiconductor device including, on a plurality of electrodes of a semiconductor chip or a substrate, a plurality of pin wires respectively extending vertically upward from the electrodes. The semiconductor device manufacturing apparatus includes: a wire bonding tool through which a wire is inserted; a wire clamper gripping the wire above the wire bonding tool; a moving mechanism moving the wire bonding tool and the wire clamper in XYZ directions; and a controller controlling driving of the moving mechanism. The controller: (A) presses a tip of the wire bonding tool through which the wire is inserted against the electrode of the semiconductor chip or the substrate with the moving mechanism to bond the wire to the electrode; (B) loops the tip of the wire bonding tool from the electrode to a common pressing position arranged on a surface of the semiconductor chip or the substrate with the moving mechanism, and forms a looping wire extending from the electrode to the pressing position; (C) lowers the tip of the wire bonding tool to the pressing position with the moving mechanism to press a part of the wire against the pressing position; (D) moves the tip of the wire bonding tool to be directly above the electrode with the moving mechanism to move the pressed part of the wire to be directly above the electrode; and (E) raises the wire clamper with the wire clamper closed with the moving mechanism to separate the wire from a wire supply at the part of the wire and form the pin wire extending vertically upward from the electrode. (A) through (E) are repeatedly executed to form each pin wire on each of the electrodes, and when forming the looping wire, a trajectory of the tip of the wire bonding tool is adjusted so that a length of each looping wire is set to a predetermined length.

In the semiconductor device manufacturing apparatus according to the present invention, when forming the looping wire, the controller may move the tip of the wire bonding tool in a direction opposite to the pressing position after raising the tip of the wire bonding tool from the electrode with the moving mechanism, then raise the tip of the wire bonding tool again with the moving mechanism, then move the tip of the wire bonding tool in an arc toward the pressing position with the moving mechanism, and adjust at least one of a raised height of the tip of the wire bonding tool, an amount of movement of the tip of the wire bonding tool in the direction opposite to the pressing position, and a raised height when the tip of the wire bonding tool is raised again to adjust the length of the looping wire to the predetermined length.

The semiconductor device manufacturing apparatus according to the present invention may include a discharge electrode that forms a wire tail extending from the tip of the wire bonding tool into a free air ball. The controller may control an operation of the discharge electrode, a dummy electrode may be arranged at the pressing position, and the controller may: form a first wire tail extending from the tip of the wire bonding tool into a first free air ball with the discharge electrode, press the tip of the wire bonding tool against the dummy electrode with the moving mechanism to form a bump, and extend a second wire tail from the tip of the wire bonding tool before bonding the wire to the electrode; form the extended second wire tail into a second free air ball with the discharge electrode, and bond the second free air ball onto the electrode to bond the wire to the electrode; and press the part of the wire onto the bump formed on the dummy electrode.

Effects of Invention

The present invention can improve the degree of freedom in wire shape.

DESCRIPTION OF EMBODIMENTS

A wire bonding apparatus 100 according to an embodiment will be described below with reference to the drawings. The wire bonding apparatus 100 is a semiconductor device manufacturing apparatus that manufactures a semiconductor device by forming a pin wire 55 on an electrode 35 of a semiconductor chip 34.

Figure 1:
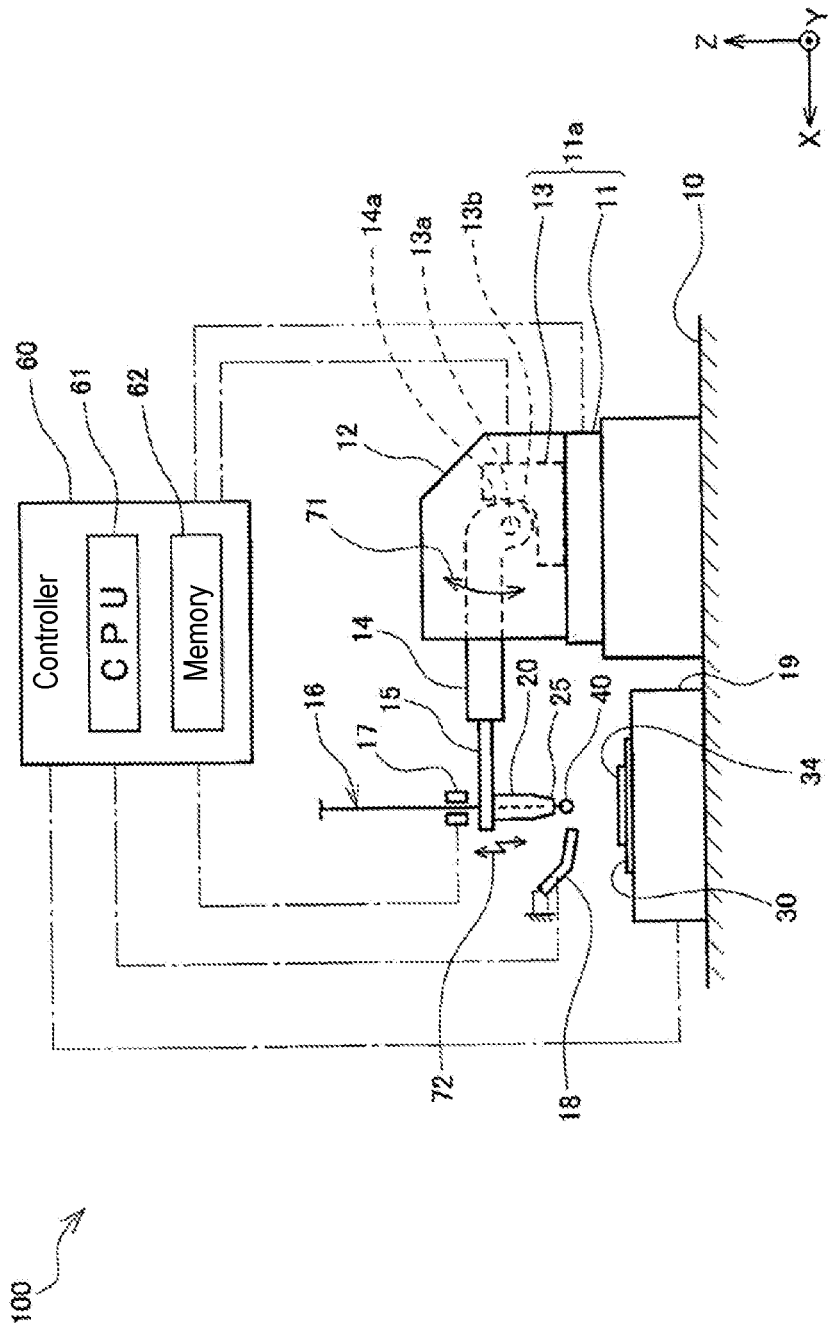
FIG. 1 is an elevational view showing the configuration of the wire bonding apparatus according to an embodiment.

As shown in FIG. 1, the wire bonding apparatus 100 includes a base 10, an XY table 11, a bonding head 12, a Z-direction motor 13, a bonding arm 14, an ultrasonic horn 15, a capillary which is a wire bonding tool, a wire clamper 17, a discharge electrode 18, a bonding stage 19, and a controller 60. In the following description, the direction in which the bonding arm 14 or the ultrasonic horn 15 extends is the X direction, the direction perpendicular to the X direction in the horizontal plane is the Y direction, and the vertical direction is the Z direction.

The XY table 11 is attached onto the base 10 and moves the object mounted on the upper side in the XY directions.

The bonding head 12 is attached onto the XY table 11 and moved in the XY directions by the XY table 11. The Z-direction motor 13 and the bonding arm 14 driven by the Z-direction motor 13 are housed in the bonding head 12. The Z-direction motor 13 includes a stator 13b. The bonding arm 14 has a root portion 14a facing the stator 13b of the Z-direction motor 13, and serves as a rotor rotatably attached around a shaft 13a of the Z-direction motor 13.

The ultrasonic horn 15 is attached to the tip of the bonding arm 14 in the X direction, and the capillary 20 is attached to the tip of the ultrasonic horn 15. The ultrasonic horn 15 ultrasonically excites the capillary 20 attached to the tip by vibration of an ultrasonic vibrator (not shown). As will be described later with reference to FIG. 2, the capillary 20 is provided with a through hole 21 penetrating therethrough in the vertical direction, and a wire 16 is inserted through the through hole 21. The wire 16 is supplied from a wire supply such as a wire spool (not shown).

Further, the wire clamper 17 is provided on the upper side of the tip of the ultrasonic horn 15. The wire clamper 17 is opened and closed to grip and release the wire 16.

The discharge electrode 18 is provided on the upper side of the bonding stage 19. The discharge electrode 18 may be attached to a frame (not shown) provided on the base 10. The discharge electrode 18 is inserted into the capillary 20 to discharge with the wire 16 extending from a tip 25 of the capillary 20 and melt the wire 16 to form a free air ball 40.

The bonding stage 19 sucks and fixes a substrate 30 having the semiconductor chip 34 mounted thereon, and heats the substrate 30 and the semiconductor chip 34 with a heater (not shown).

When the root portion 14a of the bonding arm 14 constituting the rotor is rotated by the electromagnetic force of the stator 13b of the Z-direction motor 13 of the bonding head 12 as indicated by the arrow 71 in FIG. 1, the capillary 20 attached to the tip of the ultrasonic horn 15 moves in the Z direction as indicated by the arrow 72. Besides, the bonding stage 19 is moved in the XY directions by the XY table 11. Thus, the capillary 20 is moved in the XYZ directions by the XY table 11 and the Z-direction motor 13. In addition, the wire clamper 17 moves in the XYZ directions together with the capillary 20. Thus, the XY table 11 and the Z-direction motor 13 constitute a moving mechanism 11a for moving the capillary 20 and the wire clamper 17 in the XYZ directions.

The XY table 11, the Z-direction motor 13, the wire clamper 17, the discharge electrode 18, and the bonding stage 19 are connected to the controller 60 and operate based on commands of the controller 60. The controller 60 adjusts the position of the capillary 20 in the XYZ directions with the moving mechanism 11a composed of the XY table 11 and the Z-direction motor 13, opens and closes the wire clamper 17, drives the discharge electrode 18, and controls heating of the bonding stage 19.

The controller 60 is a computer that includes a CPU 61 which is a processor internally processing information, and a memory 62 which stores operation programs, operation data, etc.

Figure 2:
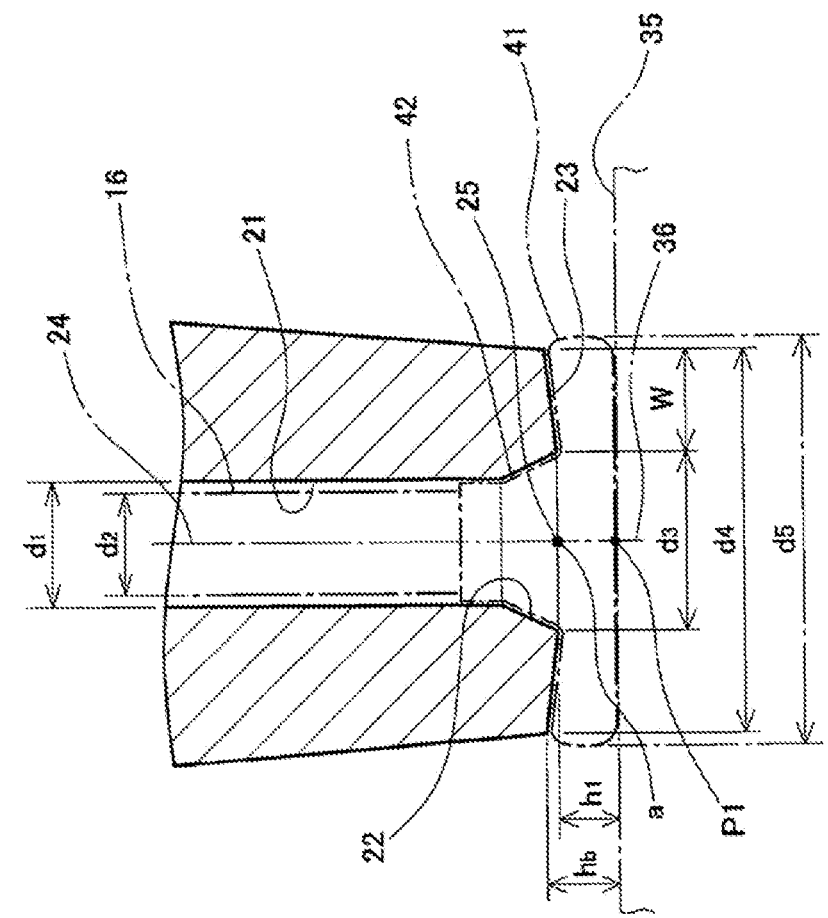
FIG. 2 is a cross-sectional view of the capillary attached to the wire bonding apparatus shown in FIG. 1.

Next, the structure of the capillary 20 will be described with reference to FIG. 2. FIG. 2 is a diagram showing an example of the tip portion of the capillary 20. The through hole 21 is formed penetrating the capillary 20 in the direction of a center line 24. The wire 16 is inserted through the through hole 21. Therefore, the inner diameter d1 of the through hole 21 is larger than the outer diameter d2 of the wire 16 (d1>d2). The lower end of the through hole 21 widens in a conical shape. This conically widening tapered portion is called a chamfer portion 22. Further, the maximum diameter (that is, the diameter at the lowermost end) of this conical space is called a chamfer diameter d3.

The lower end surface of the capillary 20 serves as a face portion 23 for pressing the free air ball 40 shown in FIG. 1. The face portion 23 may be a flat horizontal surface, or may be an inclined surface that slopes upward as it approaches the outside. The width of the face portion 23, that is, the distance between the chamfer portion 22 and the outer periphery of the lower end of the capillary 20 is called "face width W." The face width W is calculated from the chamfer diameter d3 and the outer periphery diameter d4 of the capillary 20 as $W=(d4-d3)/2$. Further, in the following description, a point on the center line 24 at the lower end of the capillary 20 is referred to as the tip 25 of the capillary 20.

As indicated by the one-dot chain line in FIG. 2, when the tip 25 of the capillary 20 is lowered to the point a at the height h1 and presses the free air ball 40 shown in FIG. 1 onto the electrode 35, the free air ball 40 is pressed by the face portion 23 and flattened to form a flat columnar crimped ball 41 having a diameter d5 and a thickness hb. In addition, a part of the metal forming the free air ball 40 enters the through hole 21 from the chamfer portion 22 to form a ball neck 42 connected to the upper side of the crimped ball 41.

Figure 3:
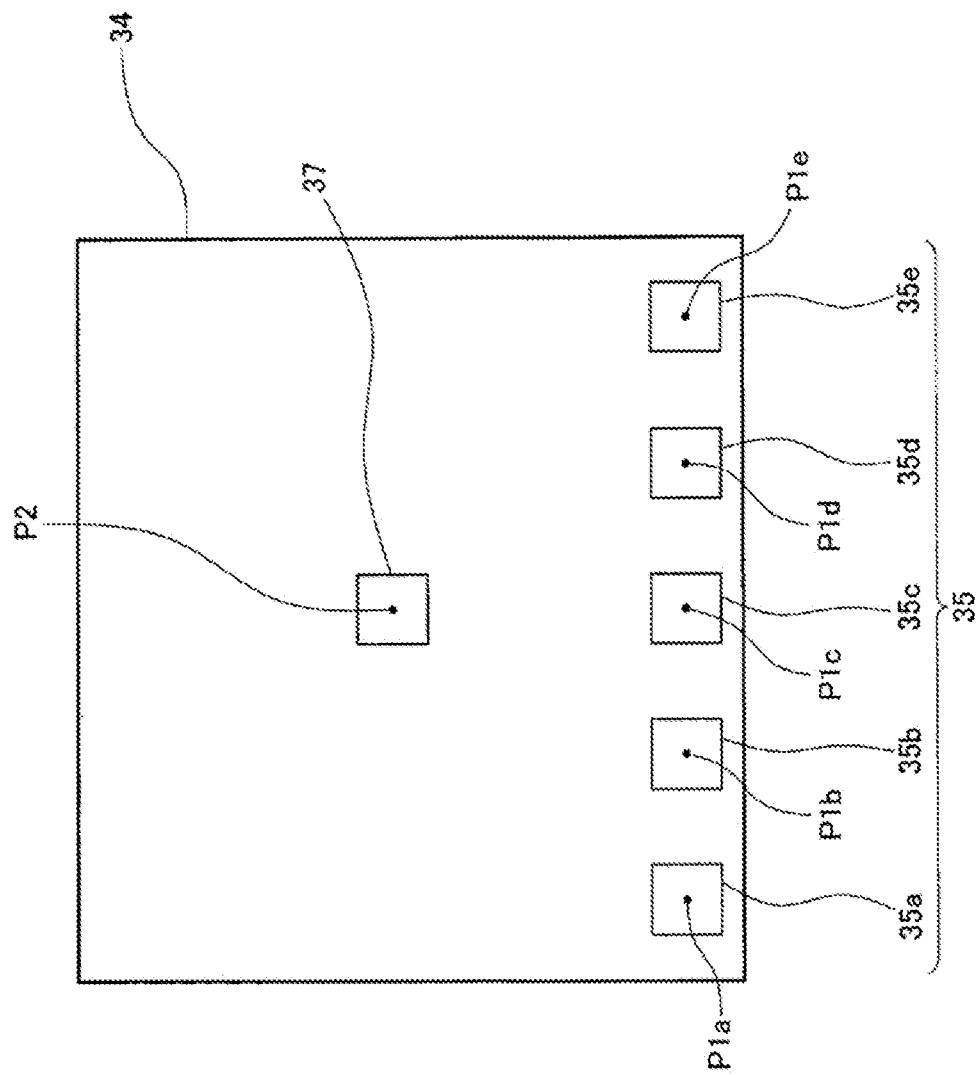
FIG. 3 is a plan view showing the electrode arrangement of the semiconductor chip.

As shown in FIG. 3, a plurality of electrodes 35 and a dummy electrode 37 common to the plurality of electrodes are arranged on the surface of the semiconductor chip 34. FIG. 3 shows five electrodes 35 from A electrode 35a to E electrode 35e and one dummy electrode 37 common to A electrode 35a to E electrode 35e. The number of electrodes 35 may be five or more, and the number of dummy electrodes 37 may be more than one. Further, in the following description, the five electrodes on the semiconductor chip 34 will be referred to as A electrode 35a to E electrode 35e when distinguished from one another, and will be referred to as the electrode 35 when not distinguished from one another.

The plurality of electrodes 35 are connected to a circuit formed inside the semiconductor chip 34 and have a mechanical structure that withstands the pressing load when connecting the wire 16. The dummy electrode 37 has the same mechanical structure as each electrode 35 and can withstand the pressing load during bonding, but is not connected to the circuit inside the semiconductor chip 34. The surfaces of the electrodes 35 and the dummy electrode 37 are all recessed from the surface of the semiconductor chip 34 (see FIG. 5A to FIG. 5K and FIG. 9A to FIG. 9G).

As described below, the wire bonding apparatus 100 forms looping wires 50a to 50e respectively between A electrode 35a to E electrode 35e and the dummy electrode 37, and then erects the looping wires 50a to 50e to be perpendicular to A electrode 35a to E electrode 35e to form pin wires 55a to 55e respectively on A electrode 35a to E electrode 35e.

First bonding points P1a to P1e for forming the pin wires 55a to 55e are located on the surfaces of A electrode 35a to E electrode 35e, and a second bonding point P2 is located on the surface of the dummy electrode 37. A wire forming method for forming the pin wires 55a to 55e using the wire bonding apparatus 100 will be described below.

First, a bump forming process for forming a bump 45 on the dummy electrode 37 will be described with reference to FIG. 4 to FIG. 6.

In the following description, a direction toward the dummy electrode 37 where the second bonding point P2 is located when viewed from A electrode 35a where the first bonding point P1a is located is called a "forward direction", and a direction away from the dummy electrode 37 or a direction opposite to the dummy electrode 37 when viewed from A electrode 35a is called a "reverse direction." The sign "F" shown in each drawing indicates the forward direction, and the sign "R" indicates the reverse direction. In addition, the arrows 81 to 90 shown in FIG. 4 correspond to the arrows 81 to 90 shown in FIG. 5A to FIG. 5K.

The CPU 61, which is the processor of the controller 60, first opens the wire clamper 17, drives and controls the XY table 11 and the Z-direction motor 13, and moves the tip 25 of the capillary 20 near the discharge electrode 18. Then, the CPU 61 generates discharge between the discharge electrode 18 and the wire tail extending from the tip 25 of the capillary 20, and as shown in FIG. 5A, forms the wire 16 extending from the tip 25 of the capillary 20 into the free air ball 40.

Figure 4:
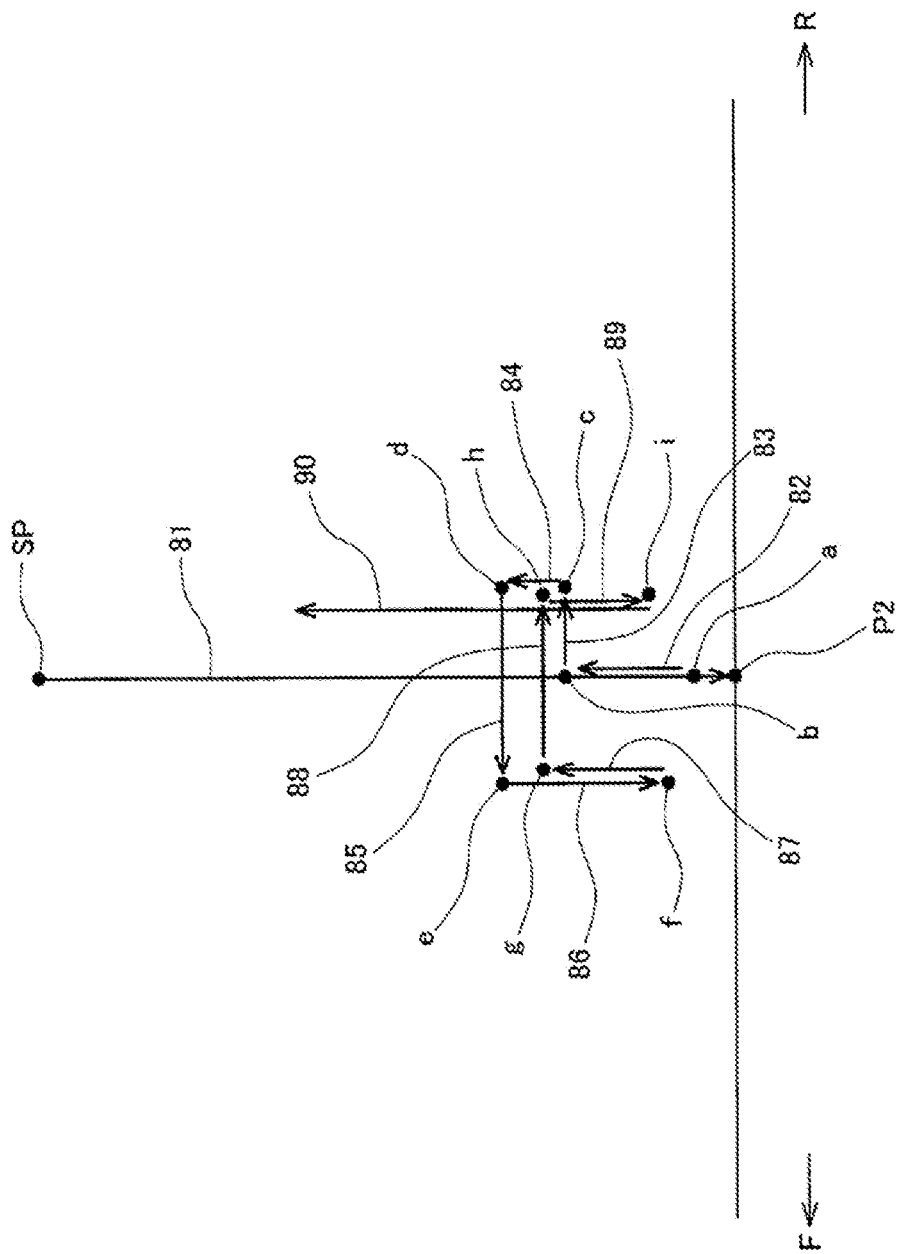
FIG. 4 is an explanatory view showing movement of the tip of the capillary when forming the bump on the dummy electrode.
Figure 5A:
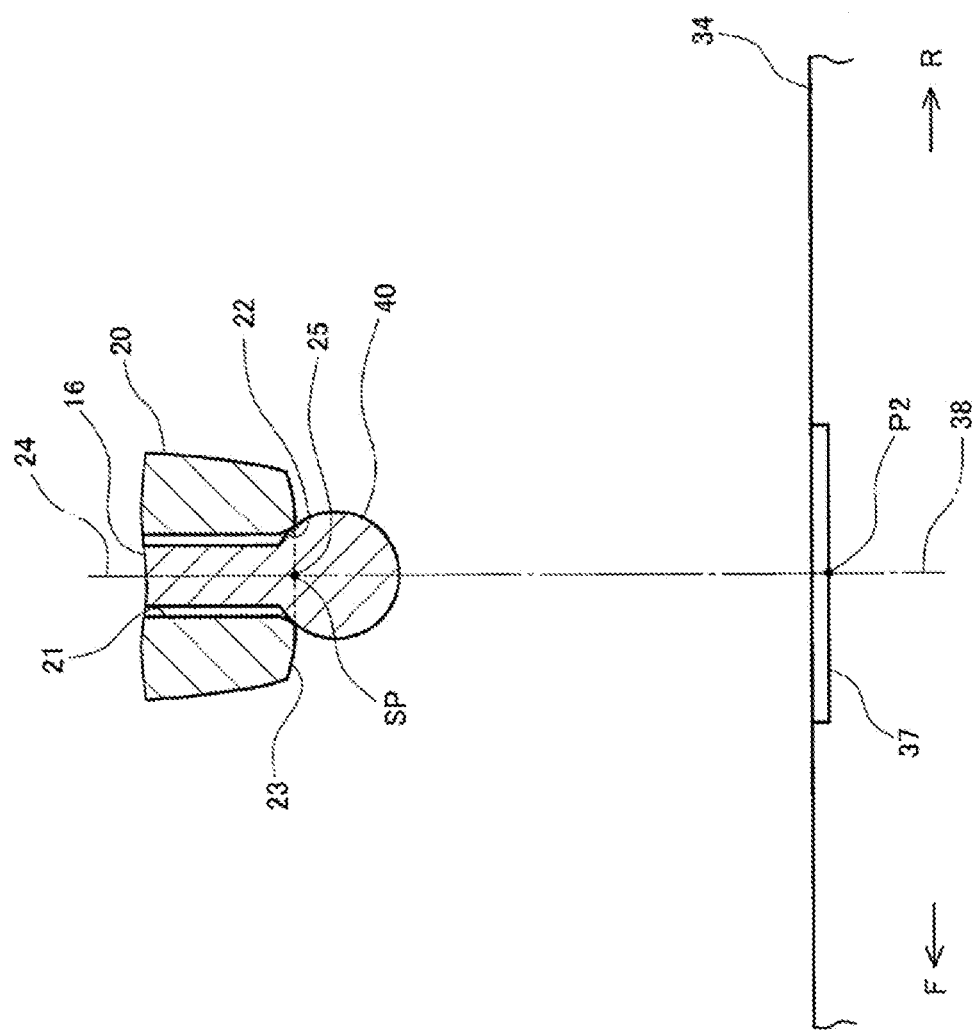
FIG. 5A is a view showing the forming process of the free air ball when forming the bump using the wire bonding apparatus shown in FIG. 1.
Figure 5B:
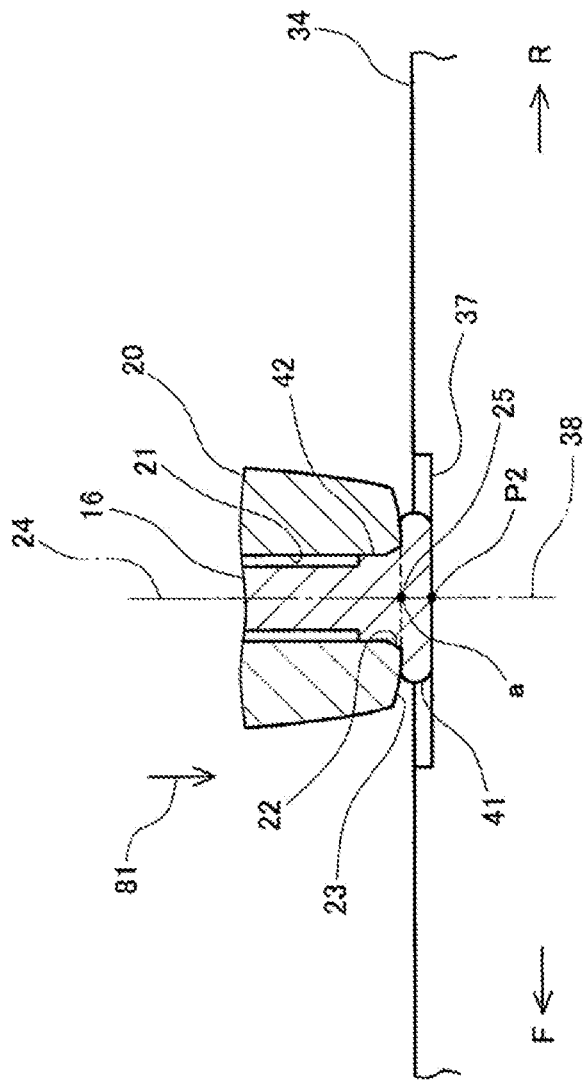
FIG. 5B is a view showing a state where the crimped ball is formed by performing ball bonding when forming the bump using the wire bonding apparatus shown in FIG. 1.
Figure 6:
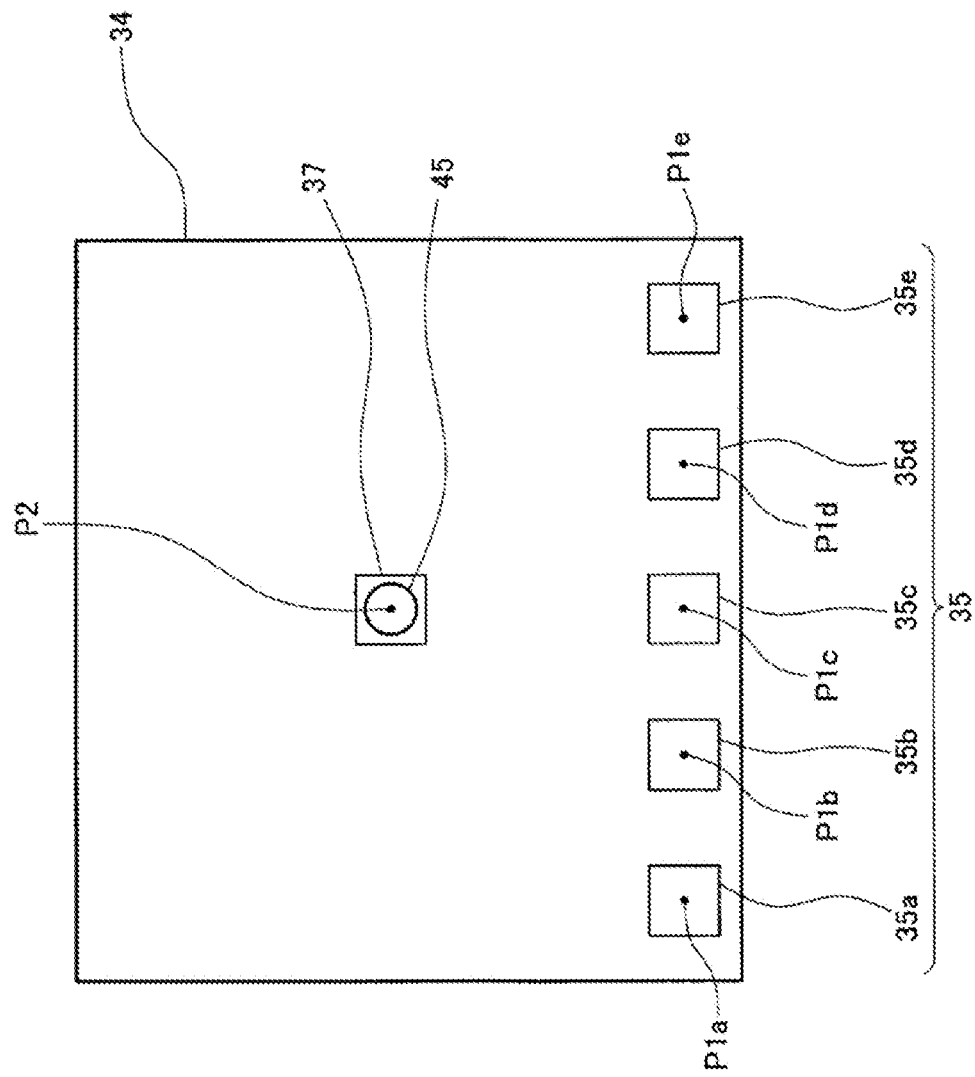
FIG. 6 is a plan view showing the electrodes of the semiconductor chip after the bump is formed.

Then, as shown in FIG. 4 and FIG. 5A, the CPU 61 drives and controls the XY table 11 and the Z-direction motor 13 to match the XY coordinates of the center line 24 of the capillary 20 with the XY coordinates of the center line 38 of the second bonding point P2 on the dummy electrode 37. Then, the CPU 61 lowers the tip 25 of the capillary 20 toward the second bonding point P2 to the point a as indicated by the arrow 81 shown in FIG. 4 and FIG. 5B, and performs ball bonding to press the free air ball 40 onto the dummy electrode 37 with the face portion 23 of the capillary 20 as shown in FIG. 5B.

When the capillary 20 presses the free air ball 40 onto the dummy electrode 37, as previously described with reference to FIG. 2, the face portion 23 and the chamfer portion 22 form the free air ball 40 into the crimped ball 41 and the ball neck 42.

Figure 5C:
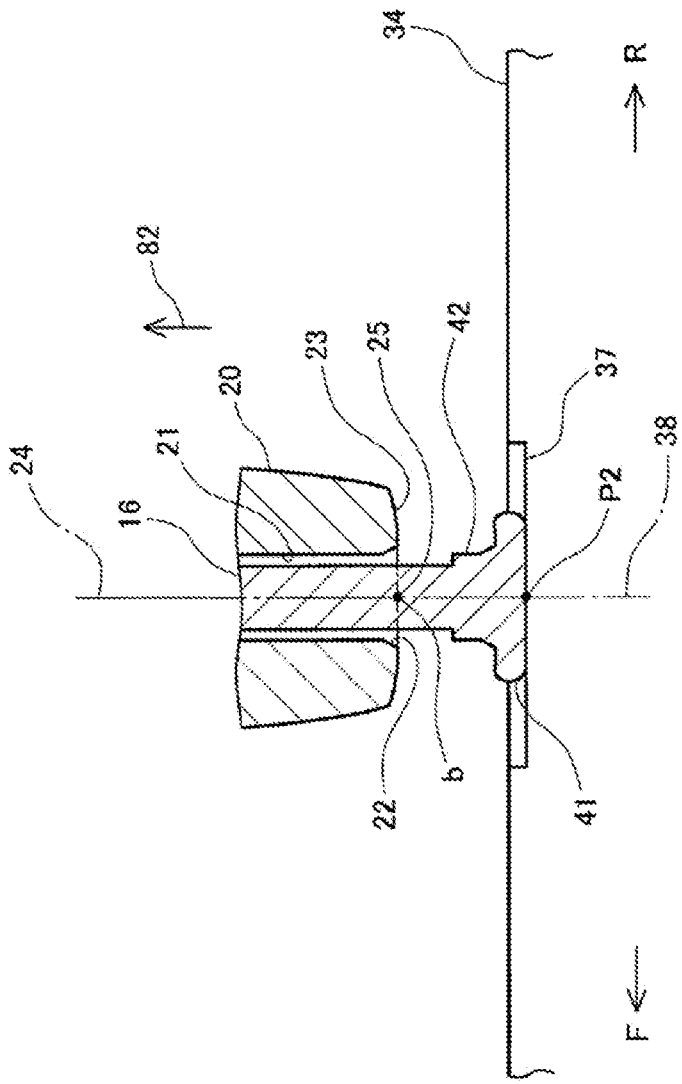
FIG. 5C is a view showing a state where the capillary is raised from the state shown in FIG. 5B.
Figure 5D:
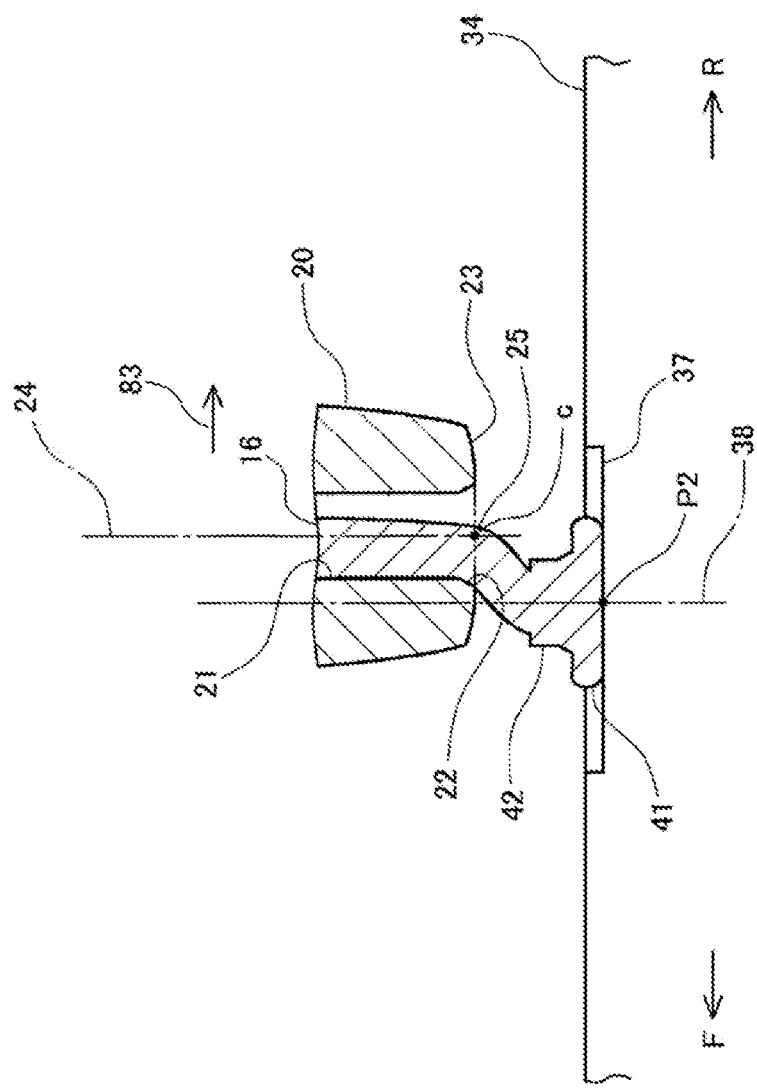
FIG. 5D is a view showing a state where the capillary is laterally moved to the reverse side from the state shown in FIG. 5C.
Figure 5E:
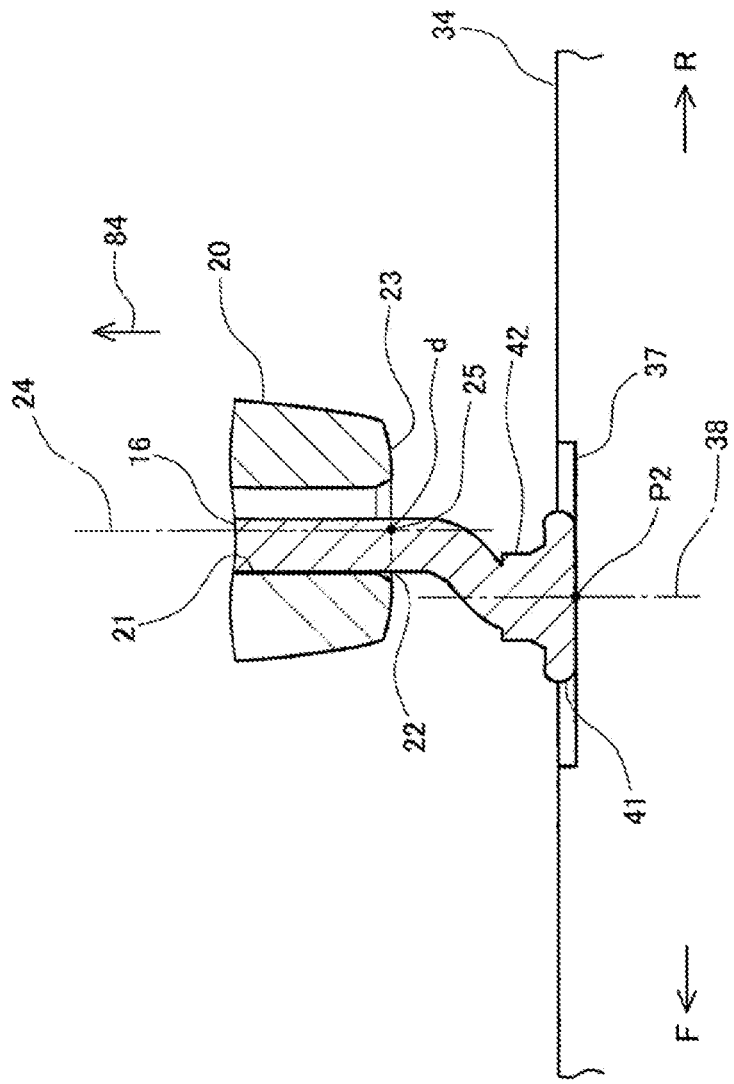
FIG. 5E is a view showing a state where the capillary is raised from the state shown in FIG. 5D.

Next, the CPU 61 drives and controls the XY table 11 and the Z-direction motor 13 as shown in FIG. 4 and FIG. 5C, and raises the tip 25 of the capillary 20 to the point b as indicated by the arrow 82 shown in FIG. 4 and FIG. 5C. Next, the CPU 61 laterally moves the tip 25 of the capillary 20 to the point c in the reverse direction as indicated by the arrow 83 shown in FIG. 4 and FIG. 5D. Then, the CPU 61 raises the tip 25 of the capillary 20 to the point d as indicated by the arrow 84 shown in FIG. 4 and FIG. 5E. Thereafter, as indicated by the arrow 85 shown in FIG. 4 and FIG. 5F, the CPU 61 laterally moves the capillary 20 to the forward side until the center in the face width direction of the face portion 23 on the reverse side of the capillary 20 is located at the XY coordinates of the center line 38 of the second bonding point P2.

Figure 5F:
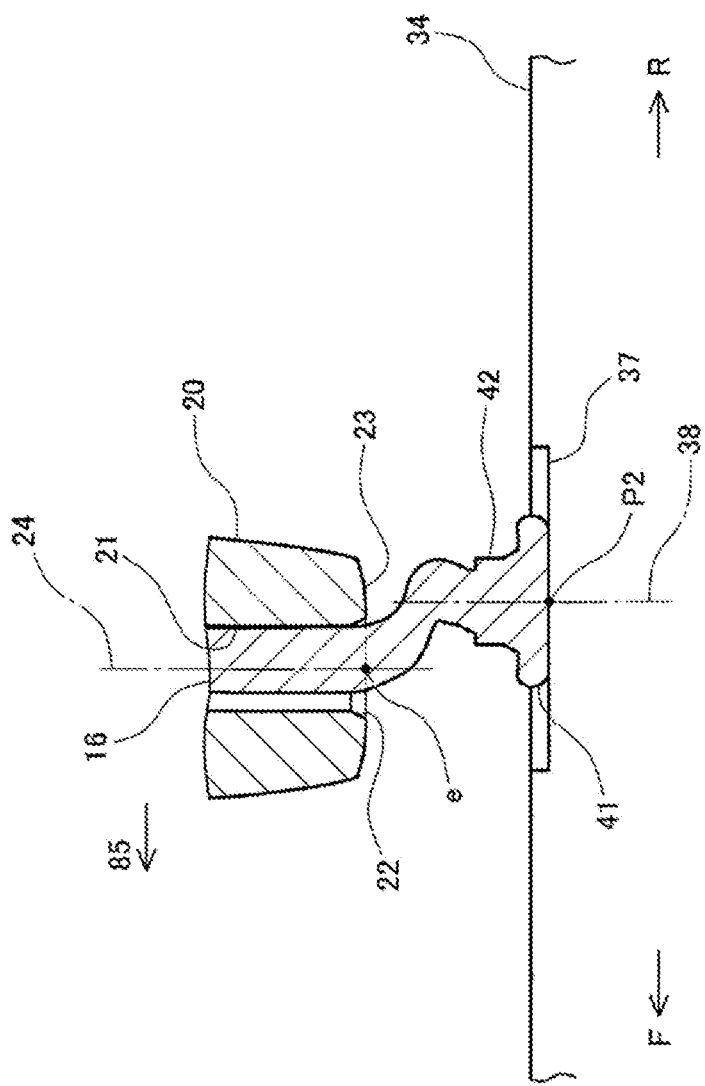
FIG. 5F is a view showing a state where the capillary is laterally moved to the forward side from the state shown in FIG. 5E and the face portion on the reverse side is located directly above the ball neck.

As indicated by the arrows 82 to 85, the tip 25 of the capillary 20 is raised and then laterally moved in the reverse direction, and then the capillary 20 is raised and then moved in the forward direction again, so that as shown in FIG. 5F, the wire 16 on the upper side of the ball neck 42 is folded over the ball neck 42 in the reverse direction and the forward direction.

Figure 5G:
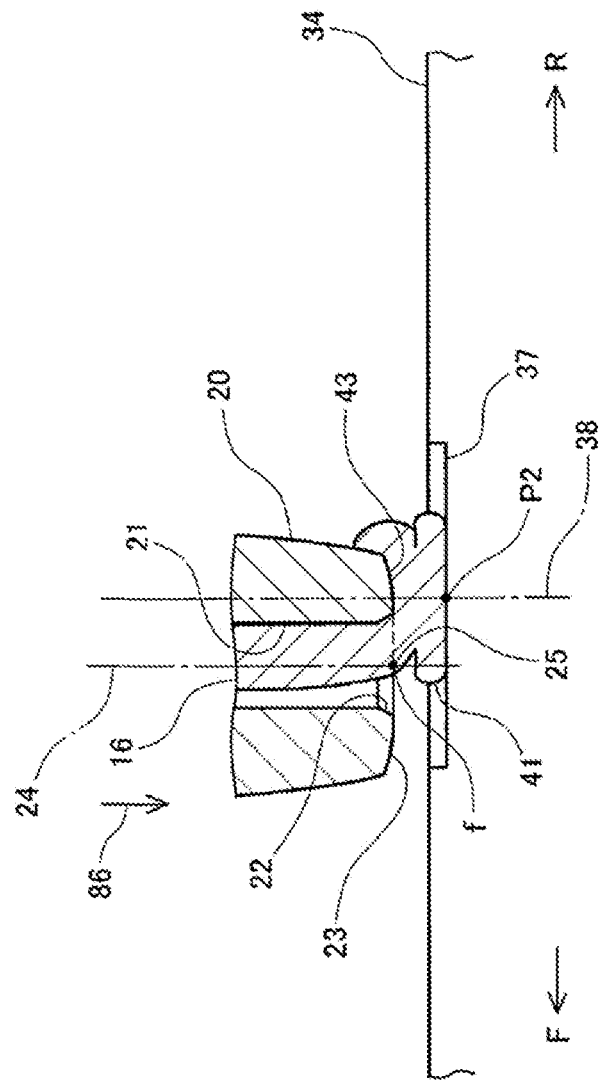
FIG. 5G is a view showing a state where the crushed portion is formed by pressing the side surface of the wire onto the ball neck with the face portion on the reverse side of the capillary.

Then, the CPU 61 drives and controls the XY table 11 and the Z-direction motor 13 to lower the tip 25 of the capillary 20 to the point f as indicated by the arrow 86 shown in FIG. 4 and FIG. 5G, and presses and crushes the side surface of the wire 16 folded over the ball neck 42 in the reverse direction and the forward direction onto the ball neck 42 to form a crushed portion 43.

Figure 5H:
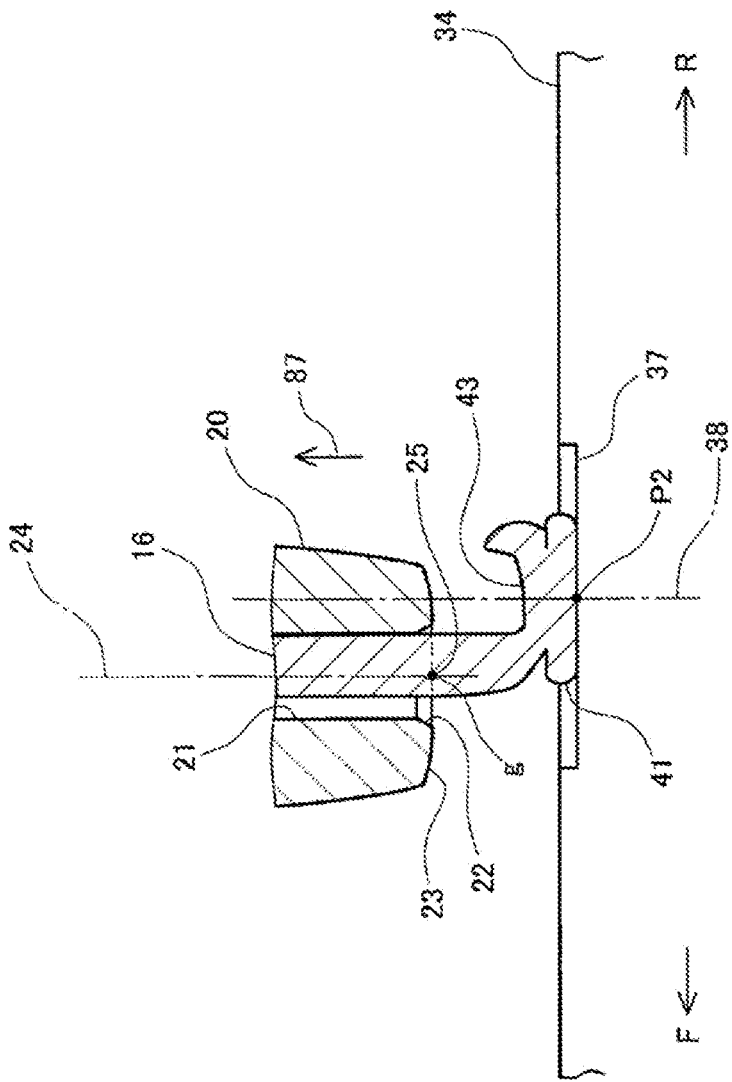
FIG. 5H is a view showing a state where the capillary is raised from the state in FIG. 5G.
Figure 5I:
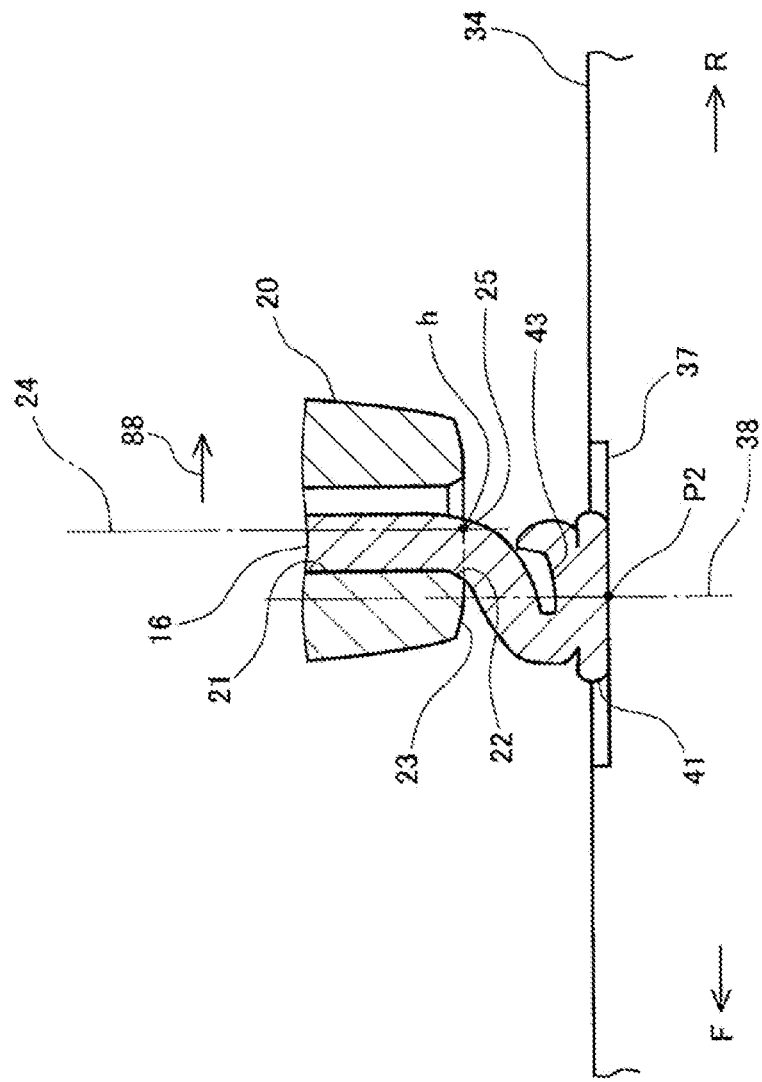
FIG. 5I is a view showing a state where the capillary is laterally moved to the reverse side from the state shown in FIG. 5H, and the face portion on the forward side is located directly above the crushed portion.

Thereafter, the CPU 61 raises the tip 25 of the capillary 20 to the point g as indicated by the arrow 87 shown in FIG. 4 and FIG. 5H, and then laterally moves the capillary 20 to the reverse side until the center in the face width direction of the face portion 23 on the forward side of the capillary 20 is located at the XY coordinates of the center line 38 of the second bonding point P2 as indicated by the arrow 88 shown in FIG. 4 and FIG. 5I.

By raising and laterally moving the capillary 20 in the reverse direction in such a manner, the wire 16 rising upward from the forward side of the crushed portion 43 shown in FIG. 5H is folded over the crushed portion 43.

Figure 5J:
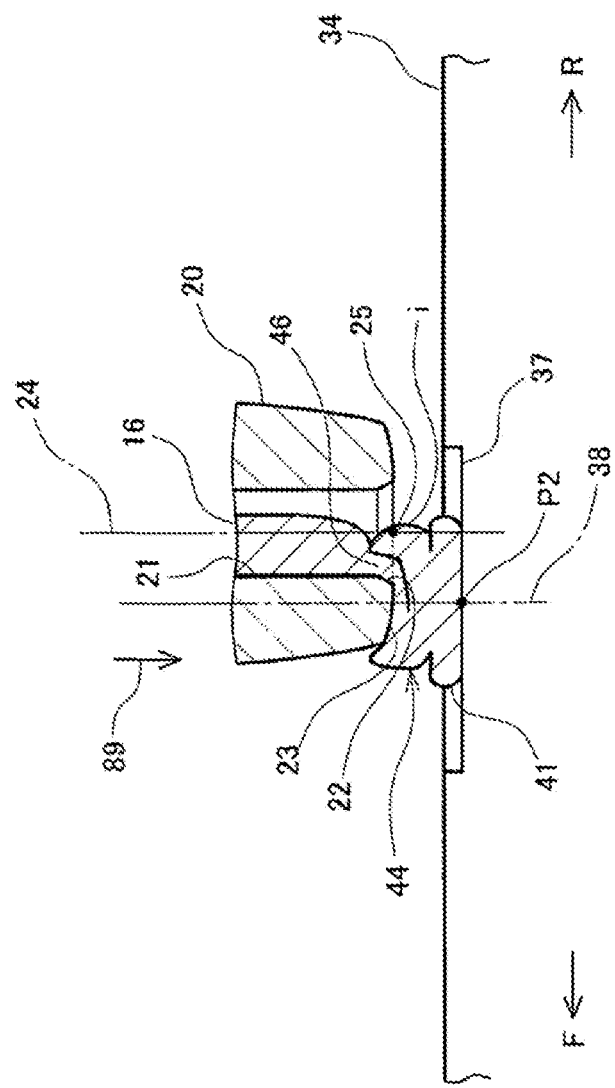
FIG. 5J is a view showing a state where the bump is formed by pressing the side surface of the wire onto the crushed portion with the face portion on the forward side of the capillary.

Then, the CPU 61 drives and controls the XY table 11 and the Z-direction motor 13, and as indicated by the arrow 89 shown in FIG. 4 and FIG. 5J, lowers the tip 25 of the capillary 20 to the point i and presses the side surface of the wire 16 onto the crushed portion 43 to form a crushed portion 44 for the second time. At this time, the crushed portion 44 and the wire 16 in the through hole 21 of the capillary 20 are connected by a thin connection portion 46.

Figure 5K:
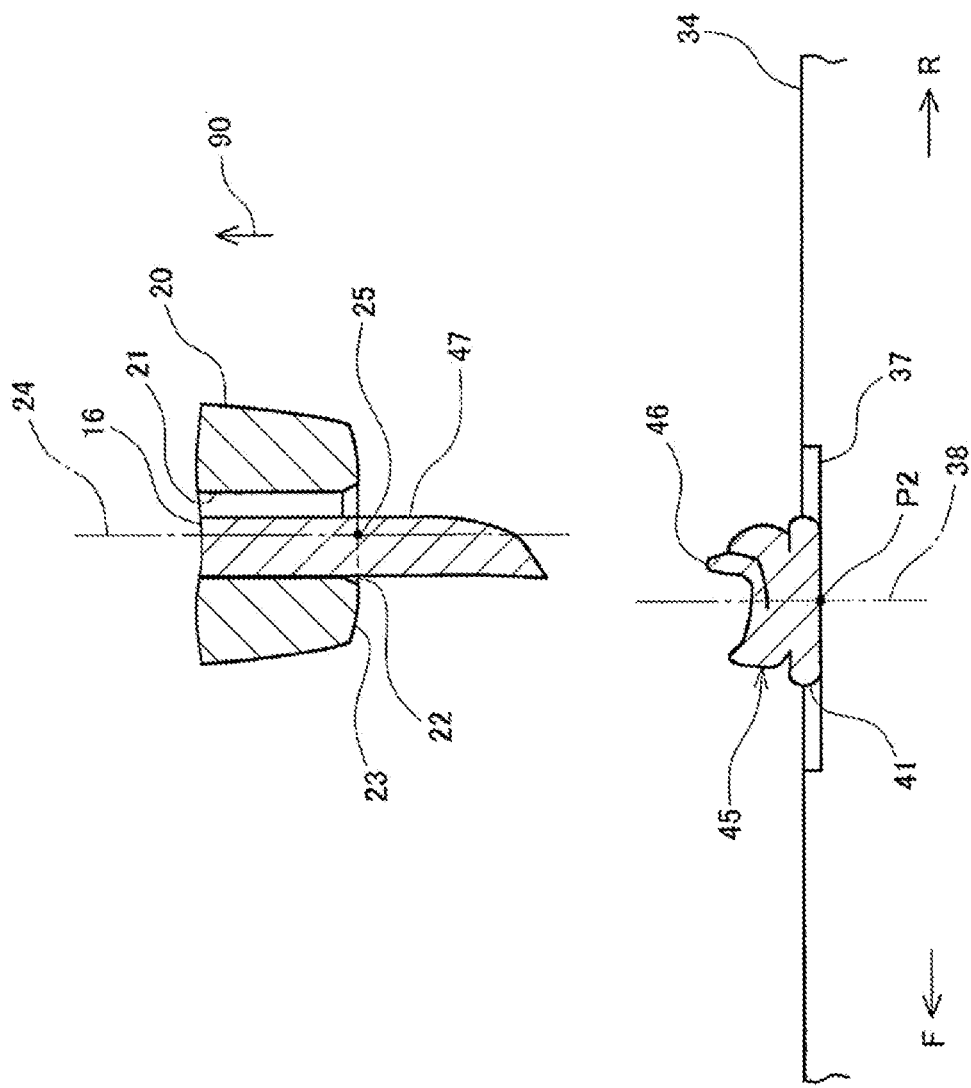
FIG. 5K is a view showing a state where the wire clamper and the capillary are raised from the state in FIG. 5J to extend the wire tail from the tip of the capillary, and then the clamper and the capillary are further raised with the wire clamper closed to separate the wire tail from the bump.

Next, the CPU 61 drives and controls the XY table 11 and the Z-direction motor 13, and raises the capillary 20 as indicated by the arrow 90 shown in FIG. 5K to extend the wire tail 47 from the tip 25 of the capillary 20. Thereafter, the CPU 61 closes the wire clamper 17 and further raises the wire clamper 17 and the capillary 20 to cut the lower end of the wire tail 47 connected to the wire supply and the connection portion 46. Thus, the bump 45 is formed on the dummy electrode 37 as shown in FIG. 5K and FIG. 6. As shown in FIG. 5K, the upper end of the bump is higher than the surface of the semiconductor chip 34.

Figure 7:
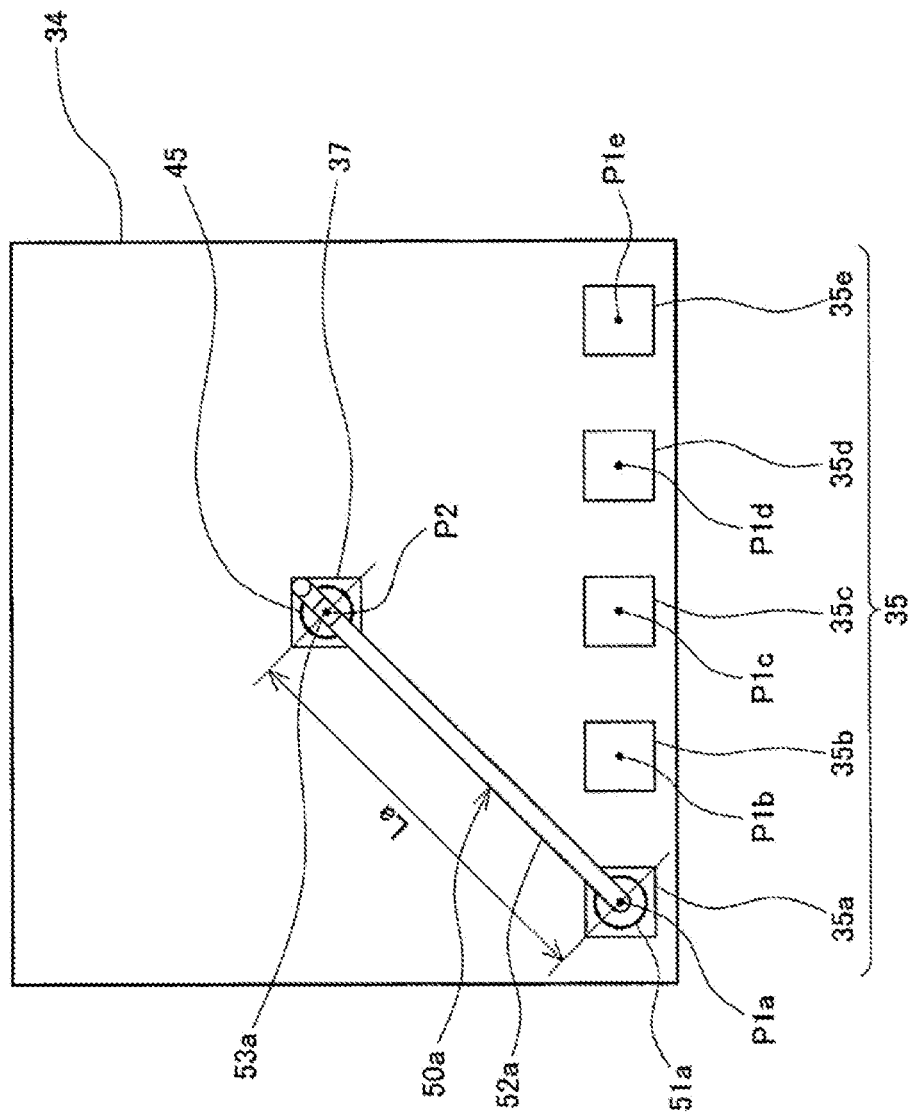
FIG. 7 is a plan view showing the looping wire formed between the A electrode and the dummy electrode.

Next, a method for forming the pin wire 55$a$ on A electrode 35$a$ will be described with reference to FIG. 7 to FIG. 12. In order to form the pin wire 55$a$, as shown in FIG. 7, after forming the looping wire 50$a$ between A electrode 35$a$ and the dummy electrode 37, the looping wire 50$a$ is erected to be perpendicular to A electrode 35$a$ to form the pin wire 55$a$ on A electrode 35$a$. As shown in FIG. 7, the distance between the first bonding point P1a on A electrode 35$a$ and the second bonding point P2 on the dummy electrode 37 is La. First, formation of the looping wire 50$a$ shown in FIG. 7 will be described. The arrows 91 to 96 shown in FIG. 8 correspond to the arrows 91 to 96 shown in FIG. 9A to FIG. 9G.

The CPU 61 of the controller 60 drives and controls the XY table 11 and the Z-direction motor 13 to move the tip 25 of the capillary 20 near the discharge electrode 18. Then, discharge is generated between the wire tail 47, which extends from the tip 25 of the capillary 20 when the bump 45 shown in FIG. 5K is formed, and the discharge electrode 18 to form the wire tail 47 into the free air ball 40 as shown in FIG. 5A.

Next, the CPU 61 drives and controls the XY table 11 and the Z-direction motor 13 to match the XY coordinates of the center line 24 of the capillary 20 with the XY coordinates of the center line 36$a$ of the first bonding point P1a on A electrode 35$a$. Then, as indicated by the arrow 91 shown in FIG. 8 and FIG. 9A, the CPU 61 lowers the tip 25 of the capillary 20 to the point p and presses the free air ball 40 onto A electrode 35$a$ to perform ball bonding and form a crimped ball 51 (bonding process).

Next, the CPU 61 drives and controls the XY table 11 and the Z-direction motor 13 to execute a looping wire forming process. First, the CPU 61 raises the tip 25 of the capillary 20 by $\Delta h1$ to the point q as indicated by the arrow 92 shown in FIG. 8 and FIG. 9B (first process). Thereafter, the CPU 61 laterally moves the tip 25 of the capillary 20 by $\Delta x1$ to the point r in the reverse direction as indicated by the arrow 93 shown in FIG. 8 and FIG. 9C (second process). Thereafter, the CPU 61 raises the tip 25 of the capillary 20 by $\Delta h2$ again to the point s as indicated by the arrow 94 shown in FIG. 8 and FIG. 9D (third process).

Figure 8:
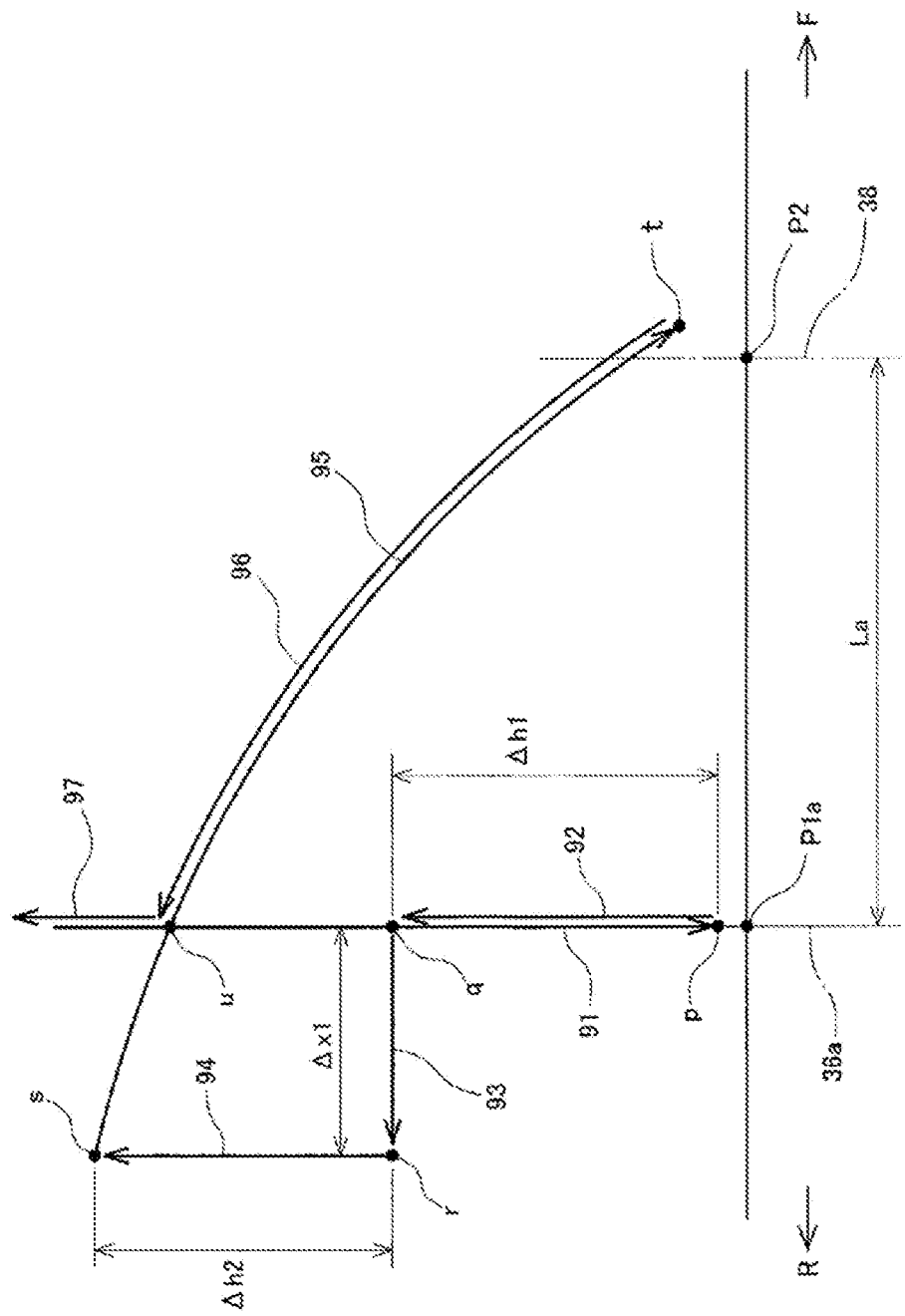
FIG. 8 is an explanatory view showing movement of the tip of the capillary when forming the pin wire on the A electrode.
Figure 9A:
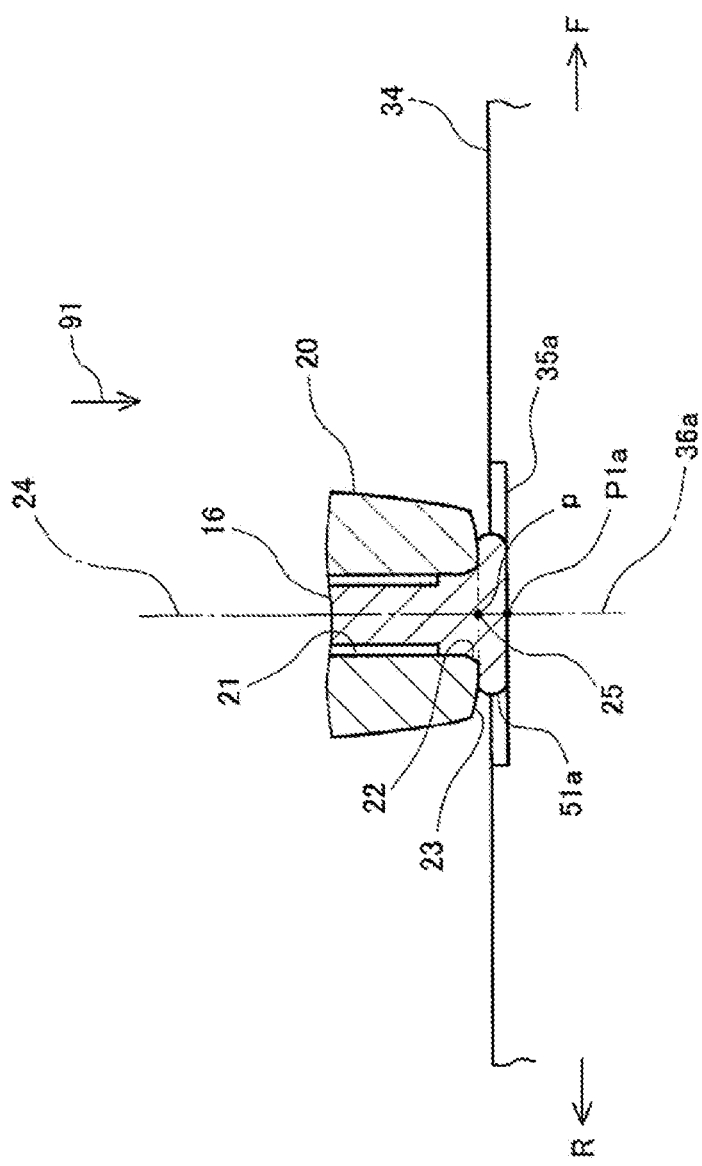
FIG. 9A is a view showing a state where the crimped ball is formed by performing ball bonding on the A electrode.
Figure 9B:
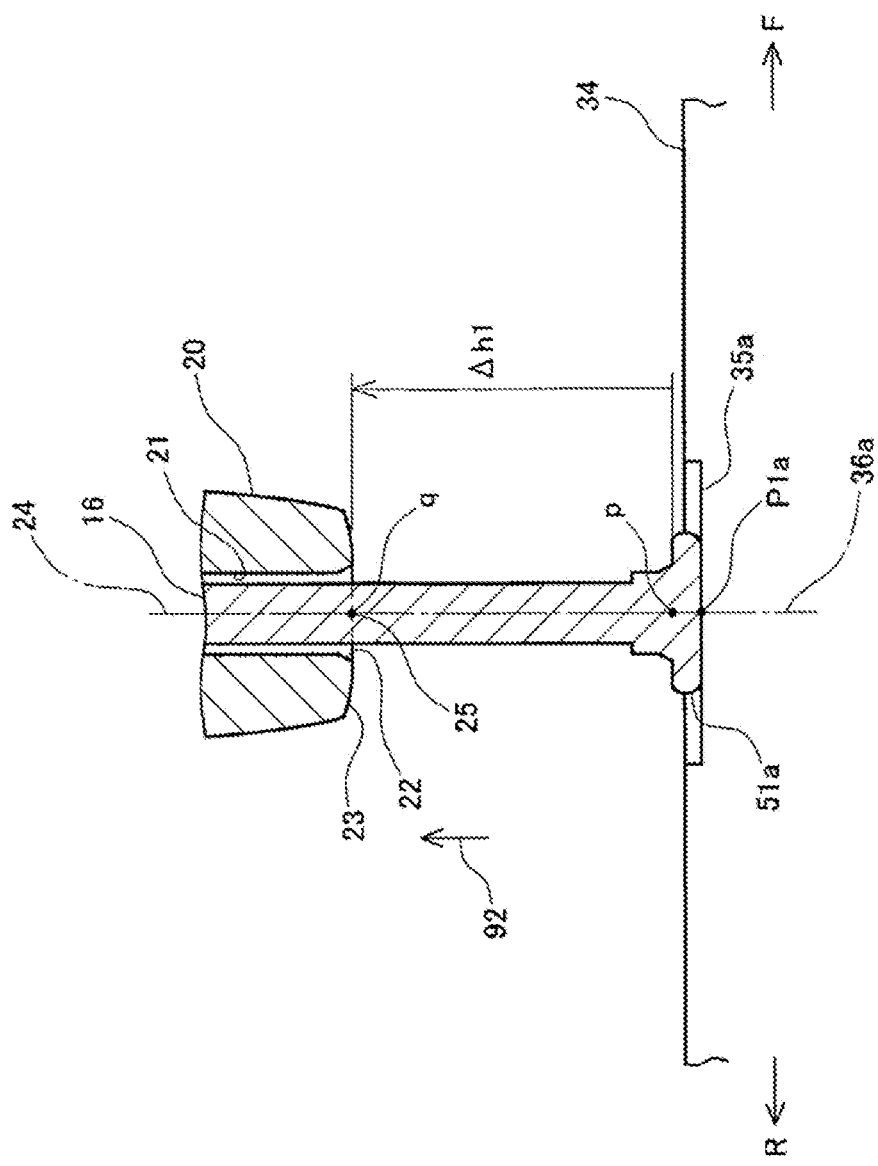
FIG. 9B is a view showing a state where the capillary is raised from the state shown in FIG. 9A.
Figure 9C:
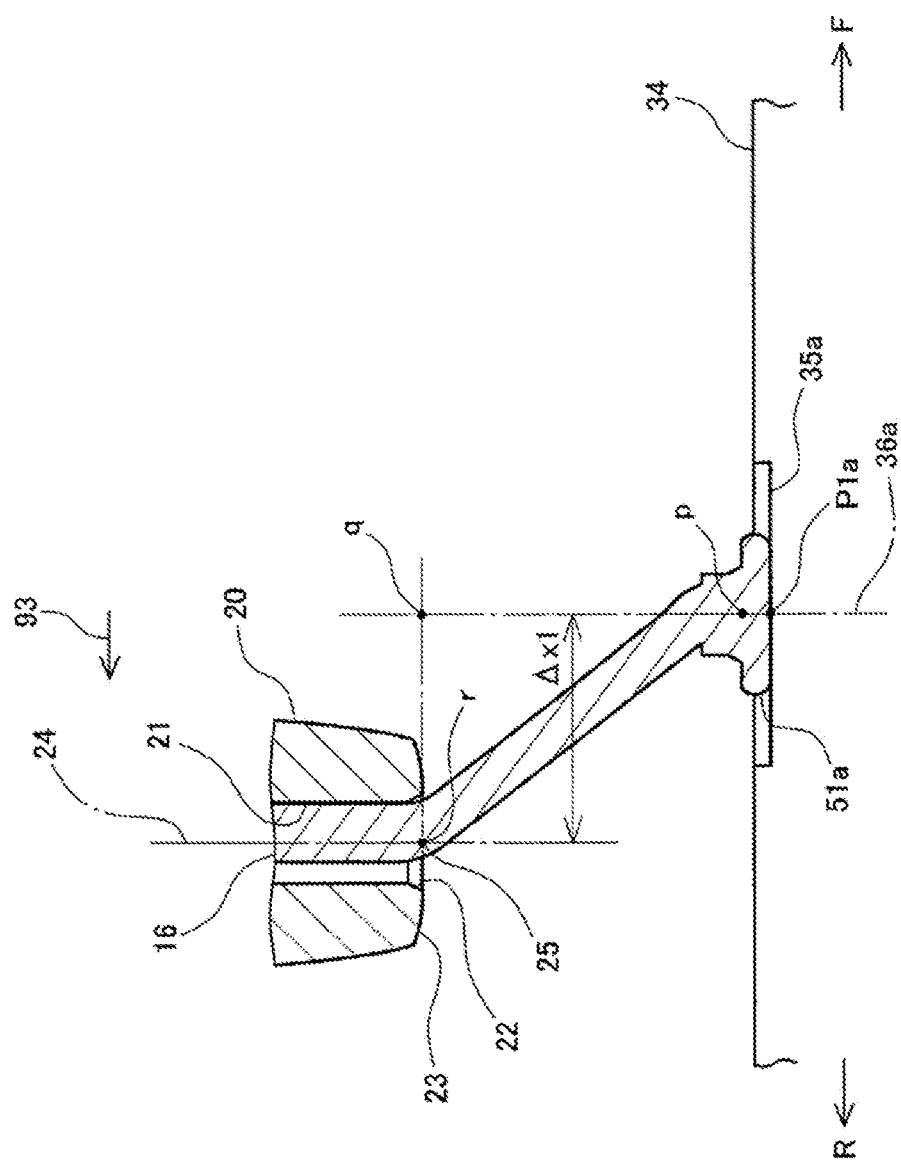
FIG. 9C is a view showing a state where the capillary is laterally moved in the reverse direction from the state shown in FIG. 9B.
Figure 9D:
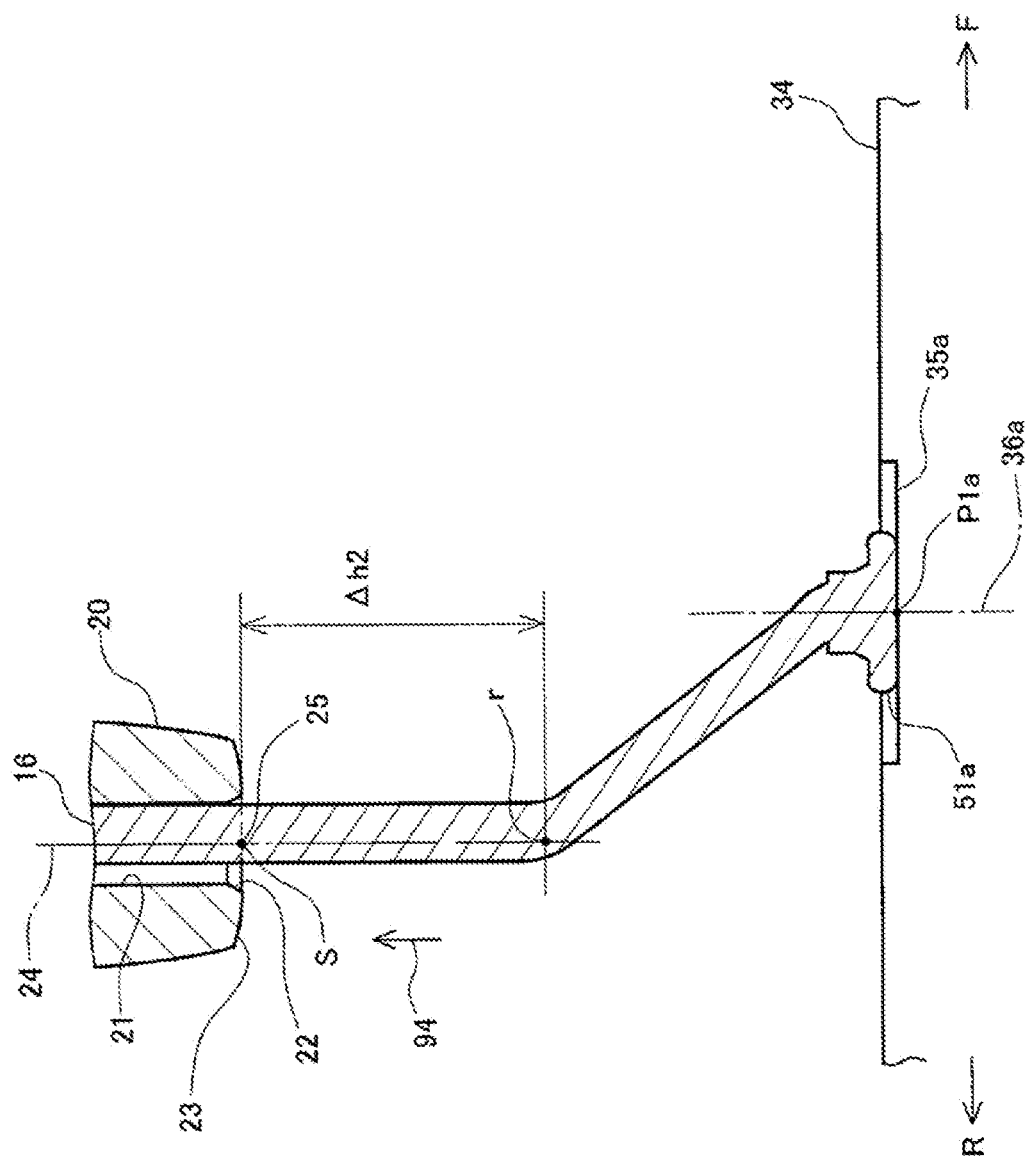
FIG. 9D is a view showing a state where the capillary is raised again from the state shown in FIG. 9C.
Figure 9E:
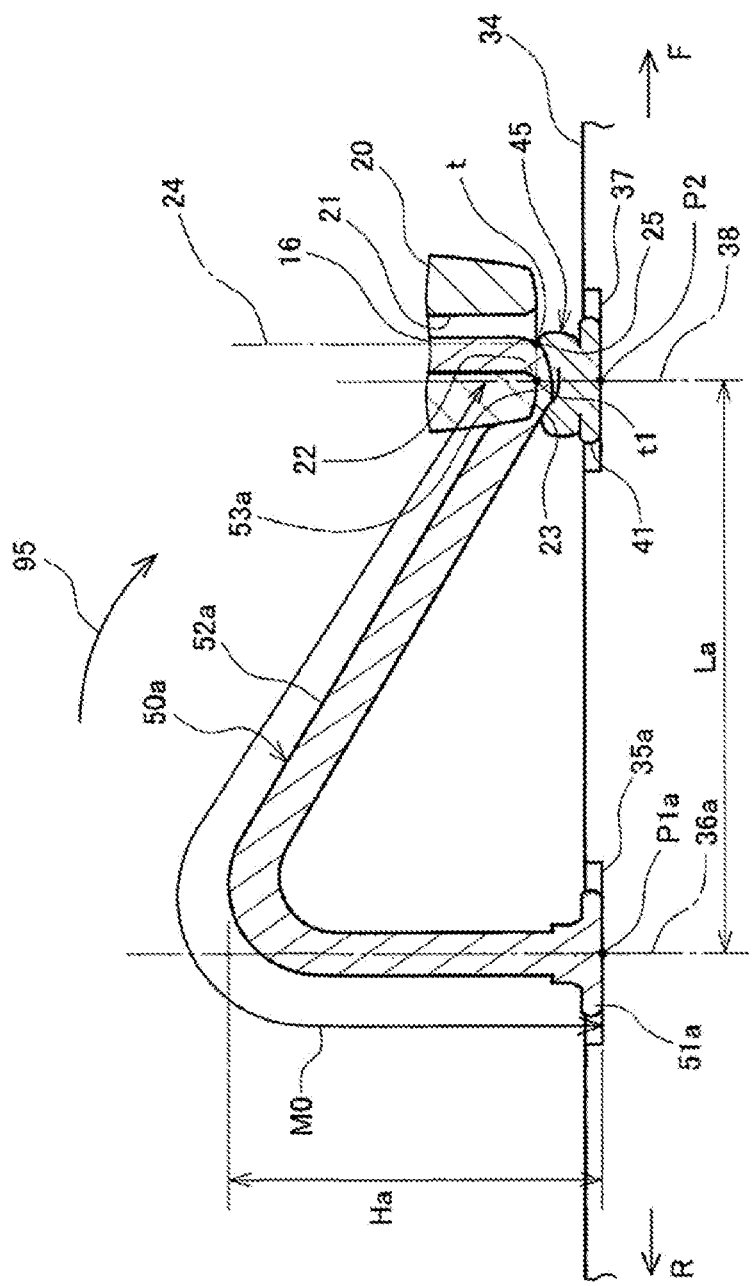
FIG. 9E is a view showing a state where a part of the wire is pressed onto the dummy electrode.

Thereafter, the CPU 61 drives and controls the XY table 11 and the Z-direction motor 13, and moves the tip 25 of the capillary 20 to the forward side in an arc as indicated by the arrow 95 shown in FIG. 8 and FIG. 9E to be above the bump 45 formed on the dummy electrode 37. At this time, the CPU 61 moves the tip 25 of the capillary 20 in an arc so that the center in the face width direction of the face portion 23 on the reverse side of the capillary 20 is located at the XY coordinate position of the center line 38 of the second bonding point P2 (fourth process).

Thereafter, the CPU 61 drives and controls the XY table 11 and the Z-direction motor 13, and lowers the tip 25 of the capillary 20 to the point t shown in FIG. 8 and FIG. 9E to press a part 53$a$ of the side surface of the wire 16 onto the bump 45 with the face portion 23 on the reverse side of the capillary 20 to form a thin portion (pressing process). Therefore, the bump 45 or the point t1 located at the XY coordinate position of the second bonding point P2 becomes the pressing position. At this time, the CPU 61 adjusts the pressing load so that the side surface of the wire 16 is not connected to the upper surface of the bump 45.

In addition, even though the upper end of the bump 45 is higher than the surface of the semiconductor chip 34, when the wire 16 is looped by the capillary 20 or when the side surface of the wire 16 is pressed onto the bump 45, the surface on the lower side of the wire 16 does not come into contact with the surface of the semiconductor chip 34. Therefore, it is possible to prevent the wire 16 from damaging the semiconductor chip 34 in the looping process and the pressing process.

As shown in FIG. 9E, when the pressing process is completed, the looping wire 50a that extends in a loop shape from the first bonding point P1a on A electrode 35a to the point t1 located on the upper surface of the bump 45 at the linear XY coordinate position of the center line 38 of the second bonding point P2 on the dummy electrode 37 is formed. The looping wire 50a includes a crimped ball 51a bonded to A electrode 35a, a loop portion 52a, and a part 53a that is pressed into the thin portion. The height of the loop portion 52a of the looping wire 50a from the surface of A electrode 35a is Ha, and the length along the loop portion 52a of the looping wire 50a from the first bonding point P1a to the point t1 is M0. In addition, the wire 16 extends from part 53a into the through hole 21 of the capillary 20 as shown in FIG. 9E.

Figure 9F:
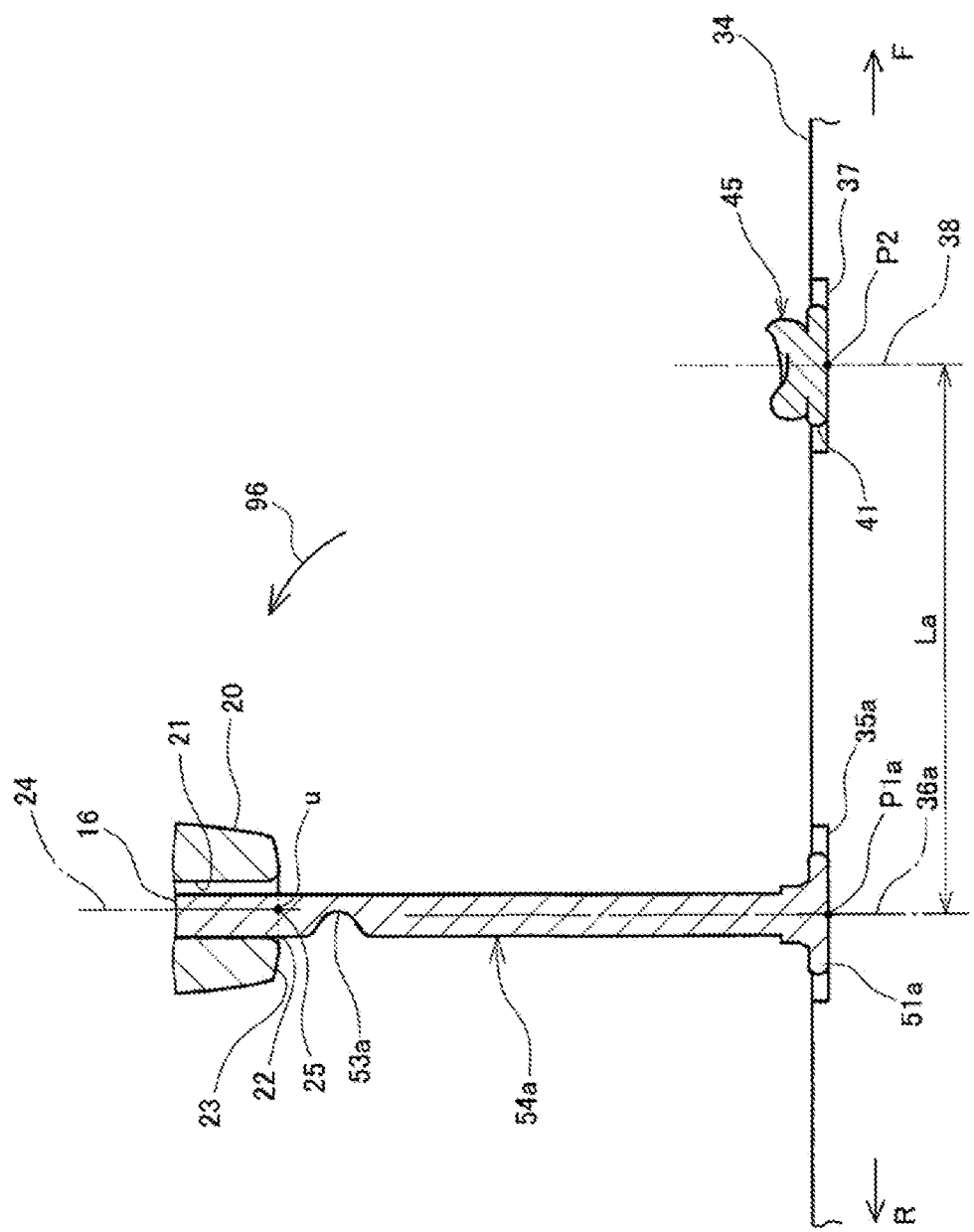
FIG. 9F is a view showing a state where the tip of the capillary is moved directly above the A electrode from the state shown in FIG. 9E.
Figure 9G:
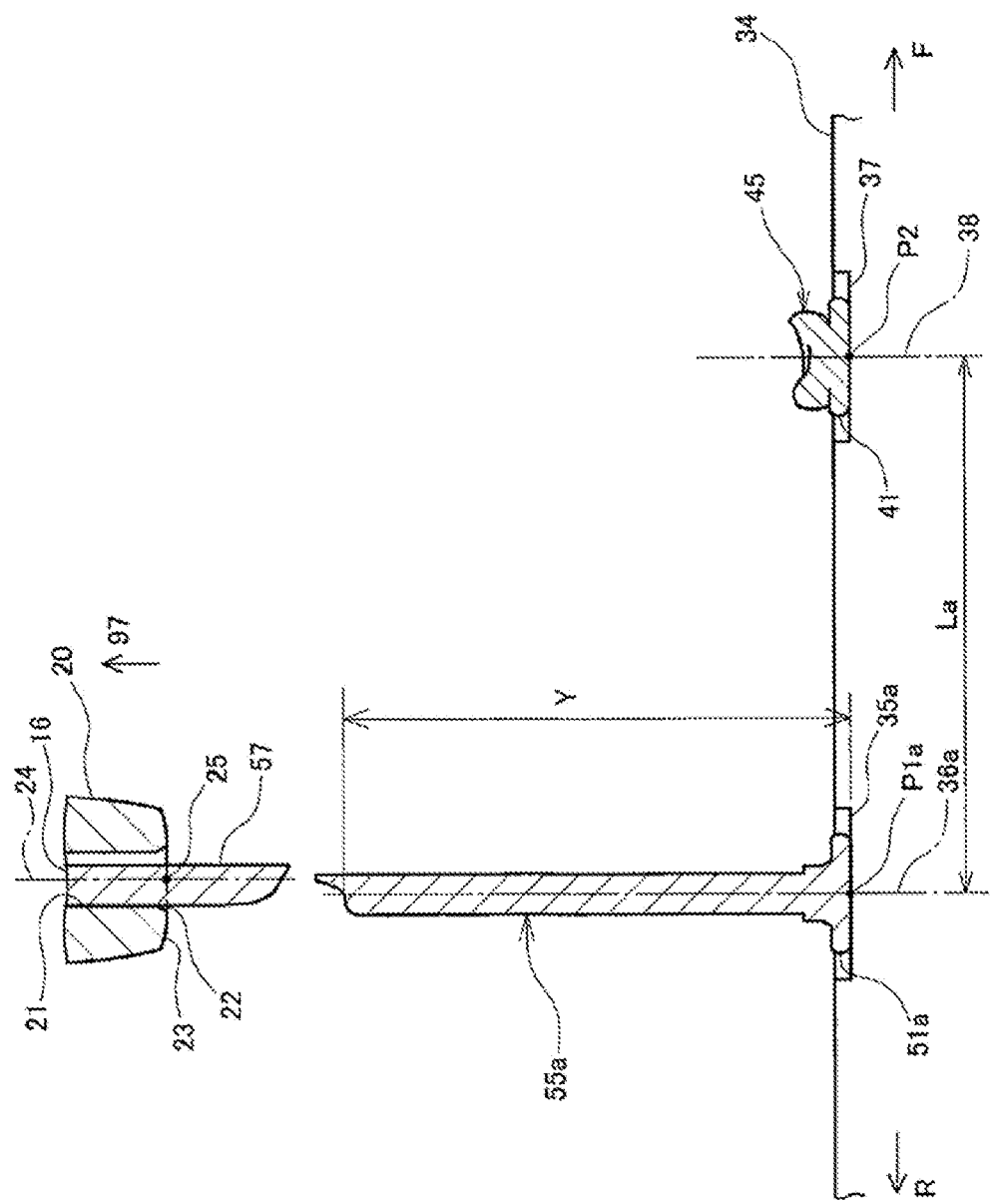
FIG. 9G is a view showing a state where the wire tail is extended from the tip of the capillary and then separated from the wire supply to form the pin wire.

Next, the CPU 61 moves the tip 25 of the capillary 20 in an arc to the point u toward the reverse side as indicated by the arrow 96 shown in FIG. 8 and FIG. 9F (moving process). Thus, the looping wire 50a is erected so that a part 53 of the wire 16 pressed in the pressing process comes directly above the first bonding point P1a. Then, the CPU 61 raises the capillary 20 to extend the wire tail 57 to the lower end of the capillary 20 as indicated by the arrow 97 shown in FIG. 8 and FIG. 9G. Thereafter, the CPU 61 closes the wire clamper 17 and raises the capillary 20 and the wire clamper 17 to separate the wire tail 57, which is connected to the wire supply, at a part 53 and form the pin wire 55a having a length of Y and extending vertically upward above A electrode 35a (wire separation process).

Figure 10:
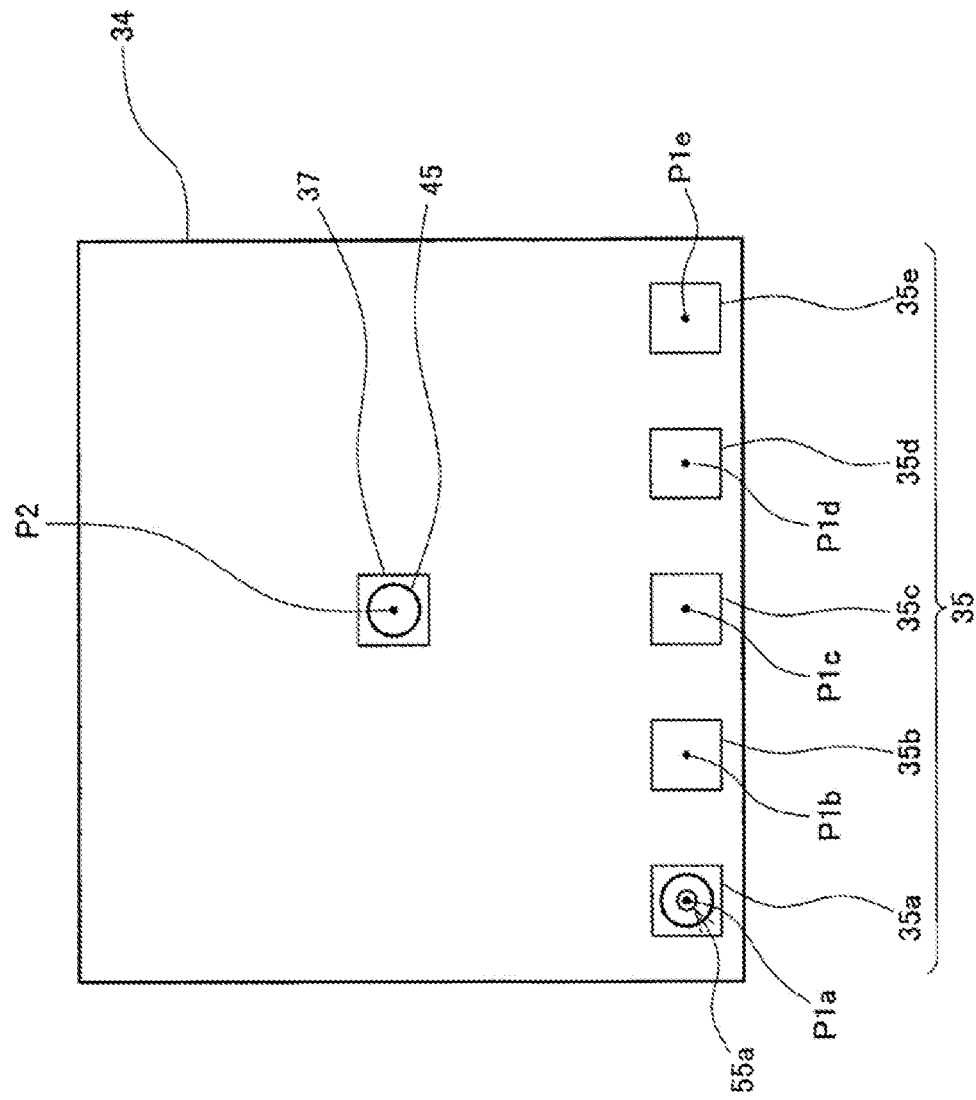
FIG. 10 is a plan view showing a state where the pin wire is formed on the A electrode.

After forming the pin wire 55a on A electrode 35a as shown in FIG. 10 by the method described above, the bump 45 remains on the dummy electrode 37.

Figure 11:
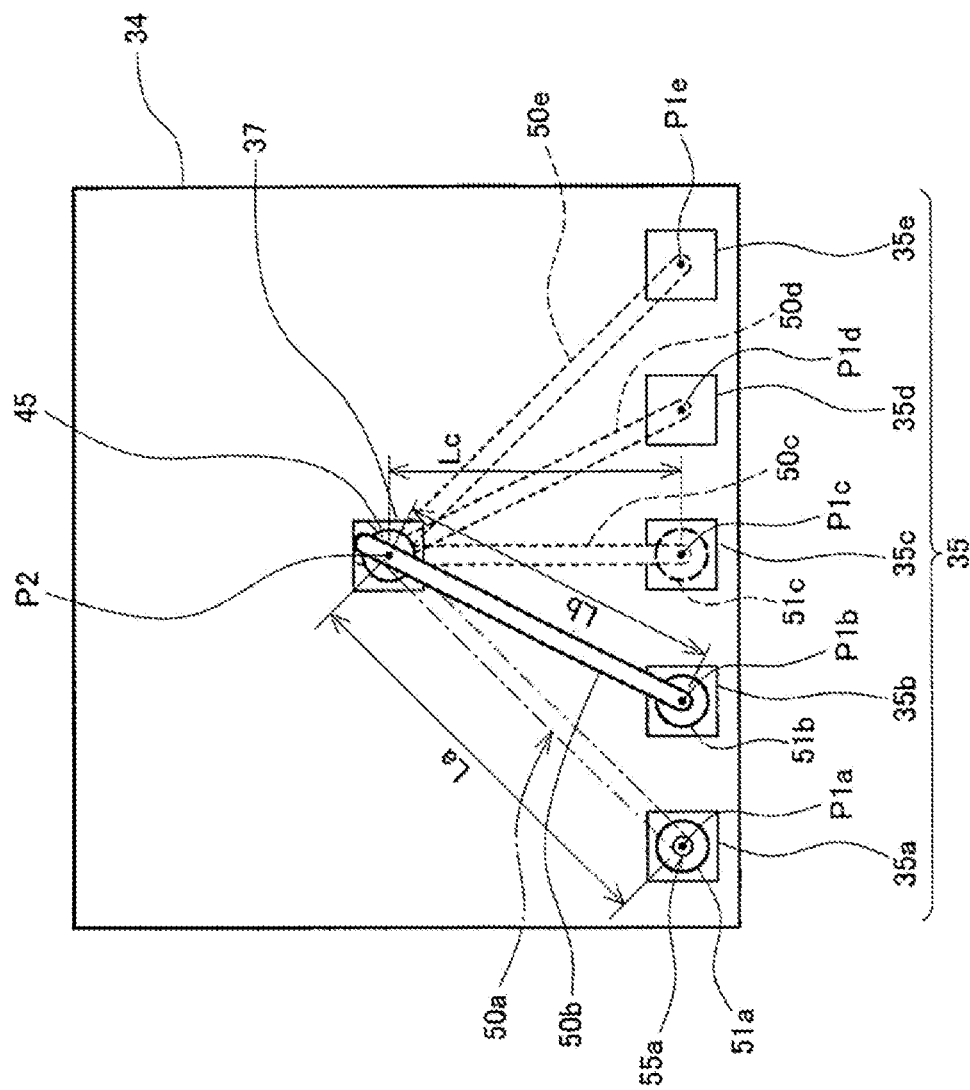
FIG. 11 is a plan view in which the looping wires formed between the A electrode to the E electrode and the dummy electrode are superimposed and displayed.
Figure 12:
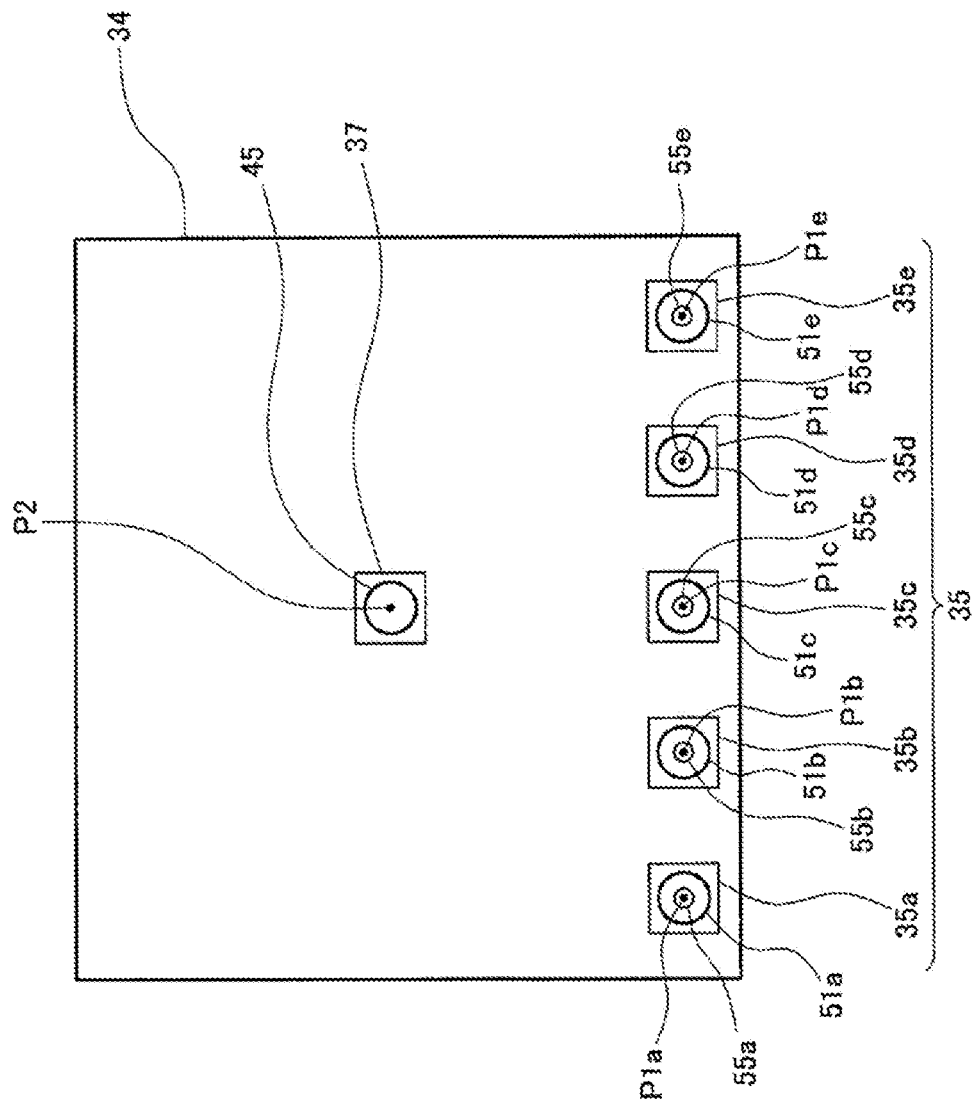
FIG. 12 is a plan view showing the pin wires formed on the A electrode to the E electrode.

Next, the CPU 61 of the controller 60 forms the looping wires 50b to 50e between B electrode 35b to E electrode 35e and the bump 45 of the dummy electrode 37 as shown in FIG. 11 and FIG. 12 by the same processes, and then erects the looping wires 50b to 50e to form the pin wires 55b to 55e.

At this time, the distance between the first bonding point P1b on B electrode 35b and the second bonding point P2 on the dummy electrode 37 is Lb which is shorter than the distance La between the first bonding point P1a on A electrode 35a and the second bonding point P2 on the dummy electrode 37a. Further, similarly, the distance Lc between the first bonding point P1c on C electrode 35c and the second bonding point P2 on the dummy electrode 37 is shorter than the distance Lb.

Here, when forming the pin wires 55b and 55c having the same height as the pin wire 55a formed on A electrode 35a on B electrode 35b and C electrode 35c, the shapes of the looping wires 50b and 50c need to be adjusted so that the lengths along the loop portions 52b and 52c of the looping wires 50b and 50c, which are the heights of the pin wires 55b and 55c, are the same as the length M0 of the loop portion 52a of the looping wire 50a.

Figure 13:
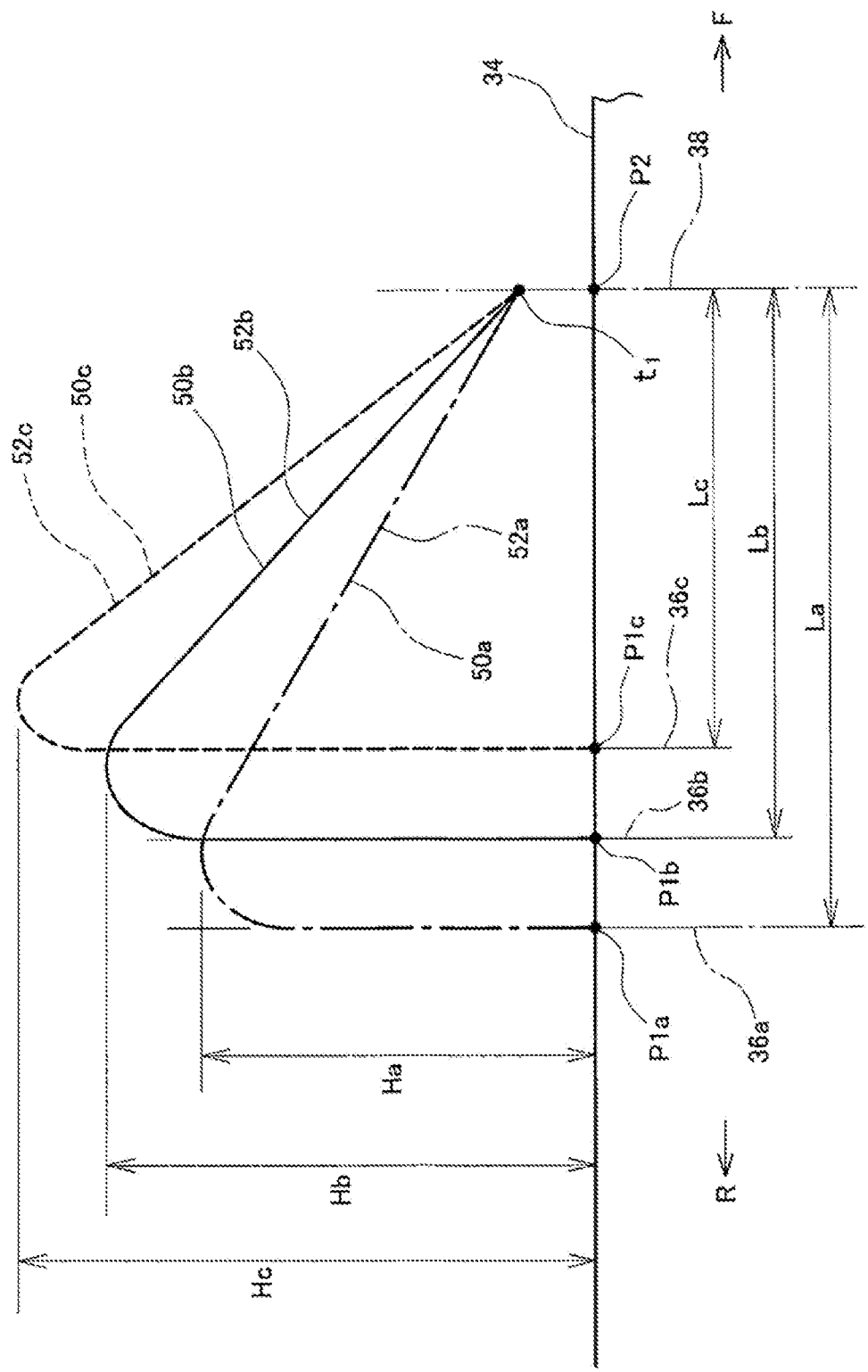
FIG. 13 is a view superimposing and displaying side views of the looping wires formed between the A electrode, the B electrode, and the C electrode and the dummy electrode.
Figure 14:
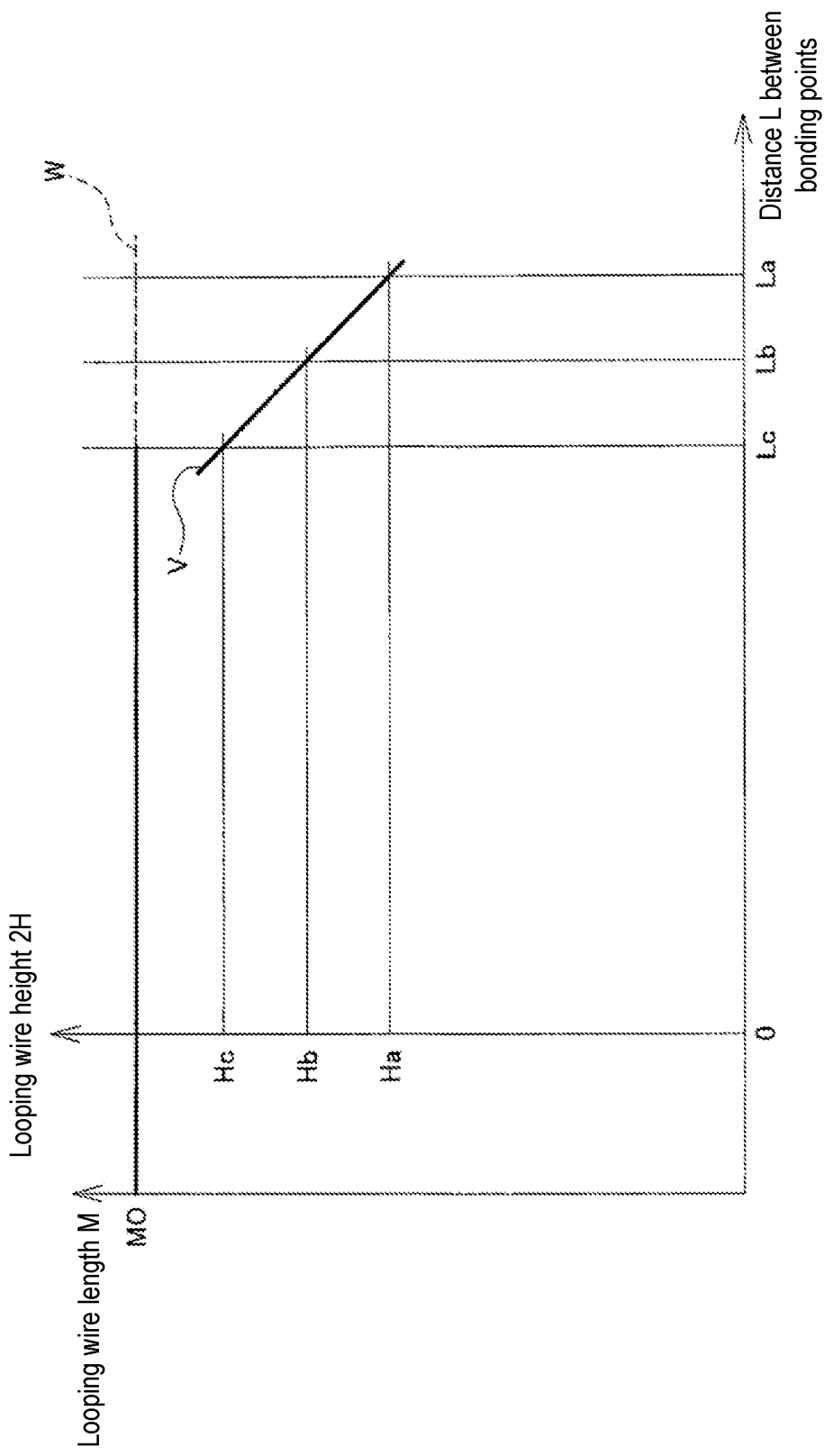
FIG. 14 is a graph showing the relationship between the distance between the bonding points where the length of the looping wire is constant, and the looping height.

Thus, as shown in FIG. 13 and FIG. 14, the CPU 61 sets the looping heights Hb and Hc of the looping wires 50b and 50c higher than the looping height Ha of the looping wire 50a so as to make the lengths along the loop portions 52b and 52c of the looping wires 50b and 50c the same as the length M0 of the loop portion 52a of the looping wire 50a.

Specifically, the CPU 61 adjusts one or a plurality of the amount of movement Δh1 of the capillary 20 in the height direction during the first process shown in FIG. 8, the amount of movement Δx1 of the capillary 20 in the reverse direction during the second process, and the amount of movement Δh2 when the capillary 20 is raised again during the third process so as to adjust to set the lengths along the loop portions 52b and 52c of the looping wires 50b and 50c the same as the length M0 of the loop portion 52a of the looping wire 50a. That is, as shown in FIG. 14, the heights Ha, Hb, and Hc of the looping wires are adjusted so as to intersect the distances La, Lb, and Lc between the bonding points at an inclination V. In addition, the lengths of the looping wires 50a to 50c may be adjusted by adjusting not only the amount of movement but also the trajectory of movement of the tip 25 of the capillary 20.

The above illustrates a case where the pin wires 55b and 55c having the same height as the pin wire 55a formed on A electrode 35a are formed on B electrode 35b and C electrode 35c, but a case where the pin wire 55d having the same height as the pin wire 55a formed on A electrode is formed on D electrode 35d is the same as a case where the pin wire 55b is formed on B electrode 35b. Moreover, a case where the pin wire 55e having the same height as the pin wire 55a formed on A electrode 35a is formed on E electrode 35e is the same as a case where the pin wire 55a is formed on A electrode 35a.

As described above, since the wire bonding apparatus 100 of the embodiment adjusts the length M along the loop portions 52a to 52e of the looping wires 50a to 55e to a predetermined length by adjusting the looping height H of the wire 16, even if the pressing position for pressing the wire 16 is a specific position having a large withstand load such as the dummy electrode 37 on the semiconductor chip 34, the heights of the pin wires 55a to 55e can be easily adjusted. Thus, it is possible to improve the degree of freedom in the shapes of the pin wires 55a to 55e while suppressing damage to the semiconductor chip 34.

Further, since the wire bonding apparatus 100 of the embodiment forms the bump 45 on the dummy electrode 37 having a large withstand load and presses the parts 53a to 53e of the wire 16 thereon, damage to the semiconductor chip 34 can be effectively suppressed. In addition, by using ball bonding to bond A electrode 35a to E electrode 35e, damage near A electrode 35a to E electrode 35e on the semiconductor chip 34 can be effectively suppressed.

Although the above describes that the bump 45 is formed on the dummy electrode 37 and the parts 53a to 53e of the wire 16 are pressed thereon, the present invention is not limited thereto. When the parts 53a to 53e of the wire 16 are pressed against a position having a large withstand load on the surface of the semiconductor chip 34, the wire 16 may be pressed against the surface of the semiconductor chip 34 without forming the bump 45.

Further, when the durability strength of A electrode 35a to E electrode 35e is high, A electrode 35a to E electrode 35e may be bonded by, for example, stitch bonding instead of ball bonding.

Next, a case of forming pin wires 551 to 554 aligned at the upper end height Z1 on the electrodes 351 to 354 at each layer of a semiconductor device 340 laminated with a plurality of semiconductor chips 341 to 344 by the wire bonding apparatus 100 of the embodiment will be described with reference to FIG. 15.

Dummy electrodes 371 to 374 are respectively arranged on the semiconductor chips 341 to 344 at each layer. First, as indicated by the arrows 981 to 984 in FIG. 15, looping wires 501 to 504 are respectively formed between the electrodes 351 to 354 and the bumps 451 to 454 formed on the dummy electrodes 371 to 374. Then, the looping wires 501 to 504 formed are erected as indicated by the arrows 991 to 994 in FIG. 15 to form the pin wires 551 to 554. The detailed operations of forming the bumps 451 to 454, forming the looping wires 501 to 504, erecting the looping wires 501 to 504, and separating from the wire supply are the same as in the method described above, and thus detailed description is omitted.

Figure 15:
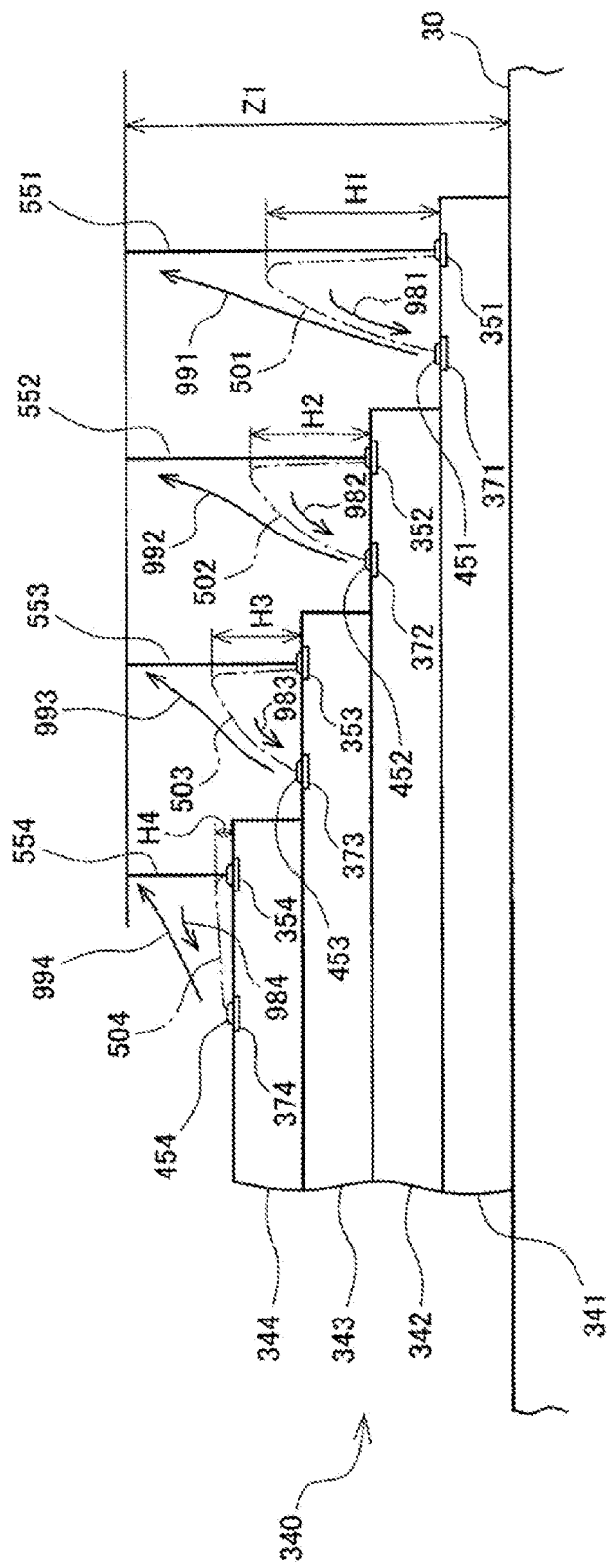
FIG. 15 is a view showing the shapes of the electrodes, the dummy electrodes, and the looping wires when forming the pin wires on the electrodes at each layer of the semiconductor device laminated with a plurality of semiconductor chips.

As shown in FIG. 15, the semiconductor device 340 is obtained by laminating the semiconductor chips 341 to 344 in four layers on the substrate 30. Therefore, the heights of the electrodes 351 to 354 of the semiconductor chips 341 to 344 at each layer are all different from one another. As shown in FIG. 15, the height of the electrode 351 of the semiconductor chip 341 at the first layer is the lowest, and the height of each electrode of the semiconductor chips 342 to 344 at the second to fourth layers increases in a stepwise manner. As shown in FIG. 15, in order to align the upper end heights Z1 of the pin wires 551 to 554 formed on the electrodes 351 to 354, it is required to increase the height of the pin wire 551 formed on the electrode 351 of the semiconductor chip 341 at the first layer, and sequentially decrease the heights of the pin wires 552 to 554 formed on the electrodes 352 to 354 of the semiconductor chips 342 to 344 at the second to fourth layers.

Thus, as indicated by the arrow 981 in FIG. 15, when forming the pin wire 551 at the first layer, the looping height H1 of the looping wire 501 formed between the electrode 351 and the bump 471 is increased to increase the length of the looping wire 501, and the looping wire 501 is erected as indicated by the arrow 991 to form the tall pin wire 551.

Further, when forming the pin wires 552 to 554 at the second to fourth layers, the looping heights H2 to H4 of the looping wires 502 to 504 are sequentially decreased according to the heights of the pin wires 552 to 554, and the looping wires 502 to 504 are erected so that the heights of the pin wires 552 to 554 decrease sequentially.

By adjusting the looping heights H1 to H4 of the looping wires 501 to 504 in this manner, the pin wires 551 to 554 having multiple kinds of heights can be freely formed.

As described above, the wire bonding apparatus 100 of the embodiment can freely form the pin wires 551 to 554 having various heights.

Although FIG. 15 illustrates a case of forming the pin wires 551 to 554 aligned at the upper end height Z1 on the electrodes 351 to 354 at each layer of the semiconductor device 340 laminated with a plurality of semiconductor chips 341 to 344, the present invention is not limited thereto. For example, it is also possible to adopt a configuration in which the pin wires 551 to 554 have different heights for each layer.

Next, another method of forming the pin wires 551a to 552a aligned at the upper end height Z1 on the electrodes 351 to 352 at each layer of the semiconductor device 340a laminated with a plurality of semiconductor chips 341 to 342 will be described with reference to FIG. 16. The detailed operations of forming the bumps 452, forming the looping wires 501a to 502a, erecting the looping wires 501a to 502a, and separating from the wire supply are the same as in the method described above, and thus detailed description will be omitted.

Figure 16:
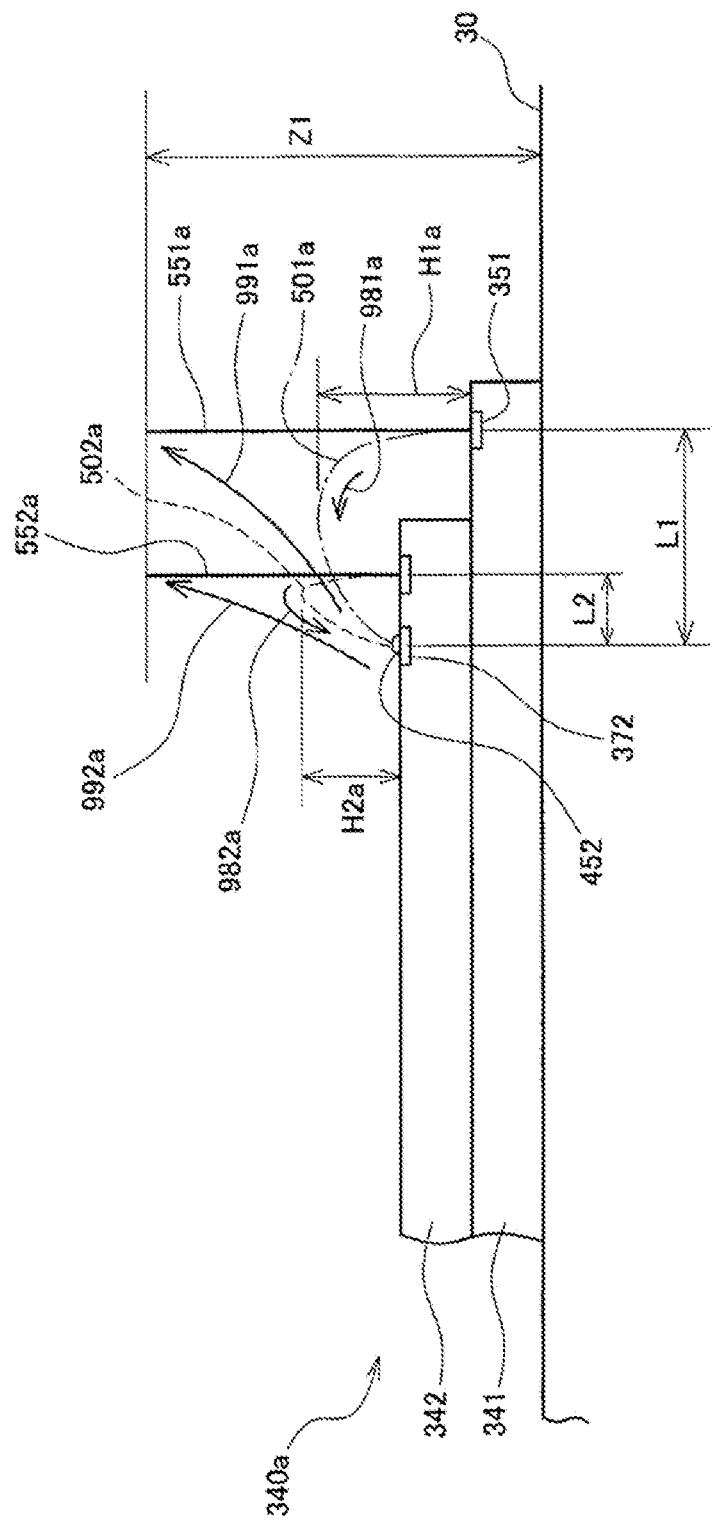
FIG. 16 is a view showing the shapes of the electrodes, the dummy electrode, and the looping wires when forming the pin wires on the electrodes at each layer of the semiconductor device laminated with a plurality of semiconductor chips.

In this example, as shown in FIG. 16, the dummy electrode 372 is arranged only on the semiconductor chip 342 at the second layer, and when forming the pin wires 551a to 552a at each of the first and second layers, the looping wires 501a to 502a are formed between the electrodes 351 to 352 at each layer and the bump 452 formed on the dummy electrode 372 at the second layer, and these are erected to form the pin wires 551a to 552a.

The looping wire 501a is formed between the electrode 351 of the semiconductor chip 341 at the first layer and the bump 452 as indicated by the arrow 981a shown in FIG. 16. The looping height of the looping wire 501a is H1a. Then, the looping wire 501a is erected as indicated by the arrow 991a shown in FIG. 16 to form the pin wire 551a.

Further, the looping wire 502a is formed between the electrode 352 of the semiconductor chip 342 at the second layer and the bump 452 as indicated by the arrow 982a shown in FIG. 16. Then, as indicated by the arrow 992a in FIG. 16, the looping wire 502a is erected to form the pin wire 552a.

Since the distance L1 between the electrode 351 at the first layer and the bump 452 is longer than the distance L2 between the electrode 352 at the second layer and the bump 452, the looping height H1a of the looping wire 501a is smaller than the looping height H2a of the looping wire 502a.

By adjusting the looping height H according to the distances L1 and L2 between the electrodes 351 to 352 and the bump 452 in this manner, the upper end heights Z1 of the pin wires 551 to 552 can be aligned with each other. Further, by adjusting the looping heights H1 to H2 of the looping wires 501 to 502, the heights of the pin wires 551 to 552 can be freely adjusted.

Furthermore, in the case of this method, the number of dummy electrodes 372 can be reduced, and the pin wires 551 to 552 can be formed by a simple method.

Although the above illustrates a method of forming the pin wires 55, 55a to 55e, 551 to 552, 551a, and 552a on the electrodes 35, 35a to 35e, and 351 to 354 of the semiconductor chips 34 and 341 to 344 with the wire bonding apparatus 100, the wire bonding apparatus 100 is also capable of forming the pin wire 55 on an electrode arranged on the substrate 30.

What is claimed is:
1. A semiconductor device manufacturing method for manufacturing a semiconductor device comprising, on a plurality of electrodes of a laminated semiconductor chip or a substrate, a plurality of pin wires respectively extending vertically upward from the electrodes, the semiconductor device manufacturing method comprising:
   (a) a bonding process of bonding a wire to the electrode with a wire bonding tool;
   (b) a looping wire forming process of looping the wire from the electrode to a common pressing position arranged on a surface of the semiconductor chip or the substrate with the wire bonding tool to form a looping wire;
   (c) a pressing process of pressing a part of a side surface the wire against the common pressing position with the wire bonding tool;

(d) a moving process of moving the pressed part of the side surface of the wire in an arc toward the electrode to be directly above the electrode with the wire bonding tool; and (e) a wire separation process of separating the wire from a wire supply at the part of the wire to form the pin wire extending vertically upward from the electrode, wherein the common pressing position is a point located on a bump on the laminated semiconductor chip or the substrate and common to the plurality of electrodes, wherein (a) through (e) are repeatedly executed to form each of the pin wires on each of the electrodes, and there are a plurality of types of distances between the common pressing position and the electrodes, and the looping wire forming process adjusts a looping height of the wire according to the type of the distance and a height of the laminated semiconductor chip from the substrate to adjust a length of the looping wire to a predetermined length and align heights of the pin wires formed at each stage, the looping wire forming process comprises: a first process of raising a tip of the wire bonding tool from the electrode; a second process of moving the tip of the wire bonding tool in a direction opposite to the pressing position after the first process; a third process of raising the tip of the wire bonding tool again after the second process; and a fourth process of moving the tip of the wire bonding tool in an arc toward the pressing position after the third process, and the length of each looping wire is adjusted to a predetermined length by adjusting an amount of movement of the tip of the wire bonding tool in at least one of the first process to the third process.

2. The semiconductor device manufacturing method according to claim 1, wherein a dummy electrode is arranged at the pressing position, the semiconductor device manufacturing method comprises a bump forming process of forming a bump on the dummy electrode before the bonding process, the bonding process performs ball bonding on the electrode, and the pressing process presses the part of the wire onto the bump formed on the dummy electrode.

3. The semiconductor device manufacturing method according to claim 2, wherein each of the electrodes is recessed from the surface of the semiconductor chip or the substrate, and the bump forming process forms the bump on the electrode so that an upper end of the bump is higher than the surface of the semiconductor chip or the substrate.

* * * * *